United States Patent
Akahane

(10) Patent No.: US 12,273,018 B2
(45) Date of Patent: Apr. 8, 2025

(54) POWER SUPPLY CIRCUIT AND SWITCHING CONTROL CIRCUIT

(71) Applicant: FUJI ELECTRIC CO., LTD., Kawasaki (JP)

(72) Inventor: Masashi Akahane, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 232 days.

(21) Appl. No.: 17/876,275

(22) Filed: Jul. 28, 2022

(65) Prior Publication Data
US 2022/0368211 A1    Nov. 17, 2022

Related U.S. Application Data

(63) Continuation of application No. PCT/JP2021/023386, filed on Jun. 21, 2021.

(30) Foreign Application Priority Data

Aug. 6, 2020    (JP) .................................. 2020-134007

(51) Int. Cl.
*H02M 1/00*    (2007.01)
*G05F 3/18*    (2006.01)
(Continued)

(52) U.S. Cl.
CPC ............ *H02M 1/0006* (2021.05); *H02M 1/08* (2013.01); *G05F 3/185* (2013.01); *H02M 1/36* (2013.01)

(58) Field of Classification Search
CPC ......... H02M 1/0006; H02M 1/08–096; H02M 1/36; G05F 3/18; G05F 3/185;
(Continued)

(56) References Cited

U.S. PATENT DOCUMENTS 4,531,084 A  *  7/1985  Hoffman  ................... H02J 7/02
                                                          323/278
4,999,567 A      3/1991  Morigami
(Continued)

FOREIGN PATENT DOCUMENTS

CN          102833908 A      12/2012
CN          103733491 A       4/2014
(Continued)

OTHER PUBLICATIONS

International Search Report for PCT/JP2021/023386, mailed on Aug. 31, 2021.
(Continued)

*Primary Examiner* — Fred E Finch, III
(74) *Attorney, Agent, or Firm* — Rabin & Berdo, P.C.

(57) ABSTRACT

A power supply circuit configured to generate an output voltage at a target level from an input voltage thereof. The power supply circuit includes a wiring configured to receive the input voltage, a variable resistor provided between the wiring and a predetermined node, a voltage generation circuit configured to apply a voltage at a predetermined level to the predetermined node based on a current from the variable resistor, an output circuit configured to output the output voltage at the target level, in response to the voltage at the predetermined level being applied to the predetermined node, and an adjustment circuit configured to increase a resistance value of the variable resistor in response to a predetermined time period having elapsed since starting of generation of the output voltage.

12 Claims, 12 Drawing Sheets

(51) Int. Cl.
*H02M 1/08* (2006.01)
*H02M 1/36* (2007.01)

(58) Field of Classification Search
CPC ......... G05F 3/20–222; G05F 3/24–242; G05F 3/267; H03K 2217/0081
See application file for complete search history.

(56) References Cited

U.S. PATENT DOCUMENTS

| | | | | |
|---|---|---|---|---|
| 5,519,313 | A * | 5/1996 | Wong | G05F 3/267 |
| | | | | 323/907 |
| 6,084,388 | A * | 7/2000 | Toosky | G05F 3/30 |
| | | | | 363/49 |
| 7,323,856 | B2 * | 1/2008 | Rabeyrin | G05F 1/468 |
| | | | | 323/901 |
| 9,520,868 | B2 * | 12/2016 | Duan | H02M 3/33507 |
| 2011/0228565 | A1 * | 9/2011 | Griffin | H02M 3/33507 |
| | | | | 363/21.01 |
| 2013/0002161 | A1 | 1/2013 | Xu et al. | |
| 2014/0176096 | A1 | 6/2014 | Yamamoto | |
| 2014/0177351 | A1 | 6/2014 | Kanagawa | |
| 2017/0310204 | A1 | 10/2017 | Kawano et al. | |
| 2019/0288592 | A1 | 9/2019 | Akahane | |
| 2020/0162074 | A1 | 5/2020 | Niikura | |

FOREIGN PATENT DOCUMENTS

| | | |
|---|---|---|
| CN | 110036557 A | 7/2019 |
| JP | S63-8810 A | 1/1988 |
| JP | S63-168511 U | 11/1988 |
| JP | H02-168307 A | 6/1990 |
| JP | H11150452 A | 6/1999 |
| JP | 2006-159472 A | 6/2006 |
| JP | 2009104455 A | 5/2009 |
| JP | 2010-160700 A | 7/2010 |
| JP | 2012257349 A | 12/2012 |
| JP | 2017-194817 A | 10/2017 |
| JP | 2020-088842 A | 6/2020 |
| WO | 2018/230196 A1 | 12/2018 |

OTHER PUBLICATIONS

Chinese Office Action dated Jun. 30, 2023, issued in the counterpart Chinese Patent Application No. 202180010890.2.
2nd Chinese Office Action dated Jan. 30, 2024, issued in the counterpart Chinese Patent Application No. 202180010890.2.

* cited by examiner

POWER SUPPLY CIRCUIT AND SWITCHING CONTROL CIRCUIT

CROSS-REFERENCE TO RELATED APPLICATIONS

This is a continuation application of International Patent Application No. PCT/JP2021/023386 filed Jun. 21, 2021, which claims the benefit of priority to Japanese Patent Application No. 2020-134007 filed Aug. 6, 2020, the entire contents of each of which the entire contents of each of which are incorporated herein by reference.

BACKGROUND

Technical Field

The present disclosure relates to a power supply circuit and a switching control circuit.

Description of the Related Art

An integrated circuit may include a power supply circuit that generates a power supply voltage Vreg to operate circuits inside the integrated circuit, based on a power supply voltage Vcc supplied from the outside (for example, Japanese Patent Application Publication No. 2006-159472).

In order to reduce a time period from when the power supply voltage Vcc is supplied to the power supply circuit to when the power supply voltage Vreg reaches a target level, in other words, a start-up time of the power supply circuit, in general, a current flowing from the power supply voltage Vcc to the power supply circuit needs to increase. However, if the current flowing from the power supply voltage Vcc to the power supply circuit increases, the level of the power supply voltage Vreg is likely to be affected by a variation in the power supply voltage Vcc.

SUMMARY

A first aspect of the present disclosure is a power supply circuit configured to generate an output voltage at a target level from an input voltage thereof, the power supply circuit having a predetermined node therein, and comprising: a wiring configured to receive the input voltage; a variable resistor provided between the wiring configured to receive the input voltage and the predetermined node; a voltage generation circuit configured to apply a voltage at a predetermined level to the predetermined node based on a current from the variable resistor; an output circuit configured to output the output voltage at the target level, in response to the voltage at the predetermined level being applied to the predetermined node; and an adjustment circuit configured to increase a resistance value of the variable resistor in response to a predetermined time period having elapsed since starting of generation of the output voltage.

A second aspect of the present disclosure is a switching control circuit configured to control switching of a first switching device on a power supply side and a second switching device on a ground side, the first and second switching devices being configured to drive a load, the switching control circuit comprising: a signal output circuit configured to output, in response to an input signal thereof, a set signal to turn on the first switching device and a reset signal to turn off the first switching device; a level shifter circuit configured to shift a level of each of the set signal and the reset signal; a driver circuit configured to drive the first switching device in response to an output from the level shifter circuit; and a power supply circuit configured to generate an output voltage at a target level from an input voltage thereof, and to supply the output voltage as a power supply voltage of the signal output circuit, wherein the power supply circuit has a predetermined node therein, and includes a wiring configured to receive the input voltage; a variable resistor provided between the wiring configured to receive the input voltage and the predetermined node, a voltage generation circuit configured to apply a voltage at a predetermined level to the predetermined node based on a current from the variable resistor, an output circuit configured to output the output voltage at the target level, in response to the voltage at the predetermined level being applied to the predetermined node, and an adjustment circuit configured to increase a resistance value of the variable resistor in response to a predetermined time period having elapsed since starting of generation of the output voltage.

BRIEF DESCRIPTION OF THE DRAWINGS

FIG. 6 is a diagram illustrating an example of a power supply circuit 40a.

FIG. 7 is a diagram illustrating an example of an operation of a power supply circuit 40a.

FIG. 8 is a diagram for describing a start-up time of a power supply circuit 40a.

FIG. 9 is a diagram for describing line regulation of a power supply circuit 40a.

DETAILED DESCRIPTION

At least following matters will become apparent from the descriptions of the present specification and the accompanying drawings.

Embodiments

Figure 1:
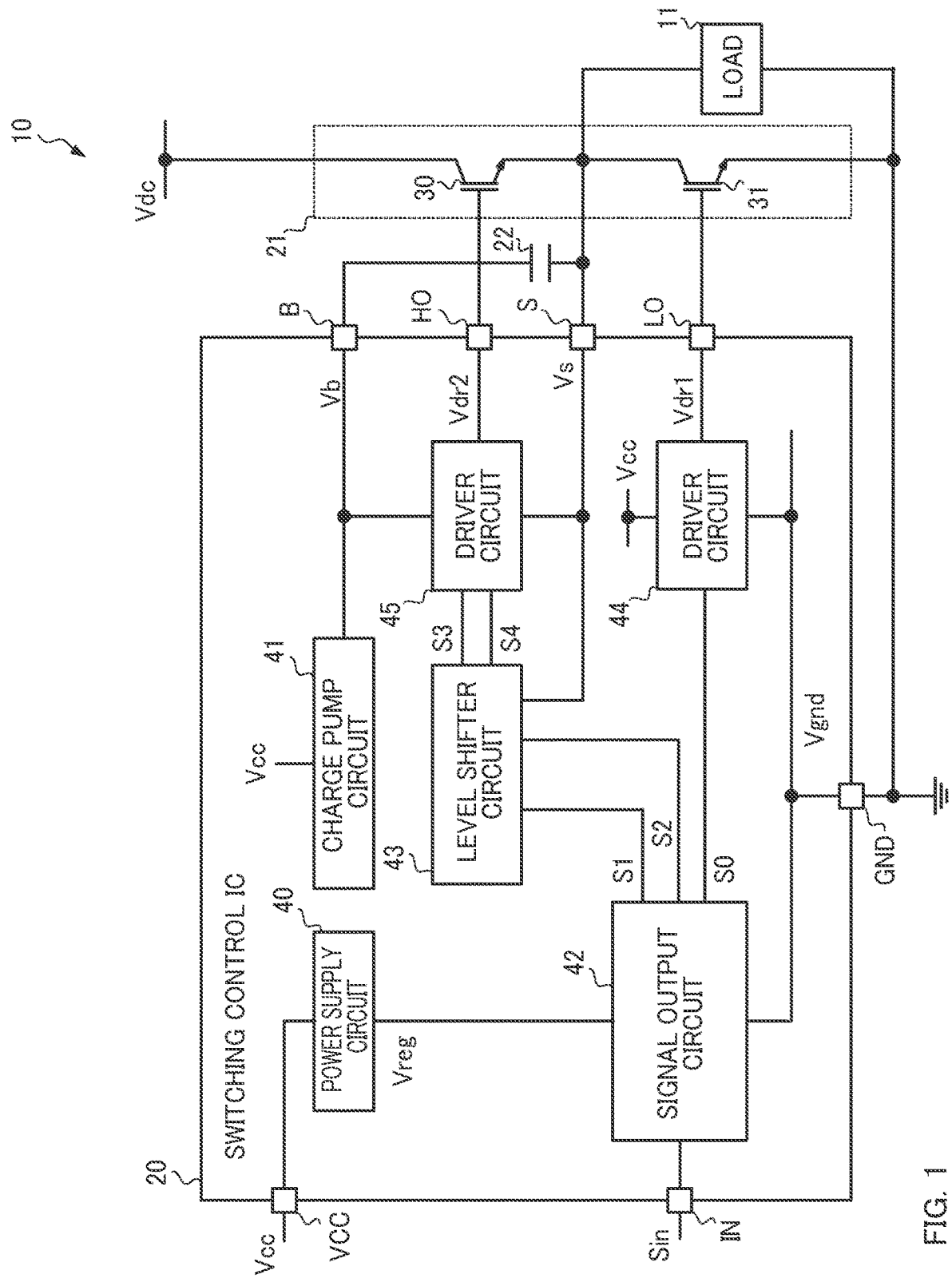
FIG. 1 is a diagram illustrating an example of a power module 10.

FIG. 1 is a diagram illustrating a configuration of a power module 10 according to an embodiment of the present disclosure. The power module 10 is a semiconductor device that drives a load 11 in response to an instruction from a microcomputer (not illustrated), and includes a switching control integrated circuit (IC) 20, a half-bridge circuit 21, and a capacitor 22.

The switching control IC 20 is a high voltage integrated circuit (HVIC) that controls an operation of the half-bridge circuit 21 in response to an input signal Sin from the microcomputer (not illustrated). The switching control IC 20 has terminals VCC, IN, GND, B, S, HO, and LO, and details of the switching control IC 20 will be described later.

The half-bridge circuit 21 drives a motor coil of an air conditioner that is the load 11, for example, and includes an insulated gate bipolar transistor (IGBT) 30 and an IGBT 31.

The IGBT 30 is a high-side switching device having a gate electrode coupled to the terminal HO, an emitter electrode coupled to the terminal S, and a collector electrode to receive a predetermined voltage Vdc (for example, "400 V").

The IGBT 31 is a low-side switching device having a gate electrode coupled to the terminal LO, a collector electrode coupled to the terminal S, and an emitter electrode grounded.

In an embodiment of the present disclosure, an IGBT is used as a switching device, however, for example, a metal-oxide-semiconductor (MOS) transistor or a bipolar transistor may be used. The IGBT 30 corresponds to a "first switching device on a power supply side", and the IGBT 31 corresponds to a "second switching device on a ground side".

The capacitor 22 has one end coupled to the terminal B, and the other end coupled to the terminal S. The capacitor 22 is charged with a bootstrap voltage Vb from a charge pump circuit 41, described later, being applied to the terminal B. As a result, the bootstrap voltage Vb is generated across the capacitor 22. The bootstrap voltage Vb is used to turn on the high-side IGBT 30.

For example, when a voltage Vs at the terminal S is "0 V", the IGBT 30 is turned on in response to the voltage at the gate electrode of the IGBT 30 exceeding a threshold voltage of the IGBT 30. However, in response to the IGBT 30 being turned on, the voltage Vs at the terminal S approaches the voltage Vdc (for example, "400 V"), and thus, in order to keep the IGBT 30 on, the IGBT 30 needs to be driven, with reference to the voltage Vs at the terminal S to which the emitter electrode of the IGBT 30 is coupled.

In an embodiment of the present disclosure, with reference to the voltage Vs at the terminal S, a voltage higher than the voltage Vs by an amount corresponding to the bootstrap voltage Vb is generated at the terminal B. Accordingly, the switching control IC 20 can turn on the IGBT 30 by using the bootstrap voltage Vb, and details will be described later.

<<<Configuration of Switching Control IC 20>>>

The switching control IC 20 includes a power supply circuit 40, the charge pump circuit 41, a signal output circuit 42, a level shifter circuit 43, and driver circuits 44 and 45.

The power supply circuit 40 generates a power supply voltage Vreg that is used inside the switching control IC 20, based on a power supply voltage Vcc (for example, "20 V") applied to the terminal VCC. The power supply circuit 40 according to an embodiment of the present disclosure is configured to generate a stable power supply voltage Vreg even when the IGBT 31 is turned on, and details will be described later.

The charge pump circuit 41 generates the bootstrap voltage Vb that charges the capacitor 22 based on the power supply voltage Vcc, for example.

The signal output circuit 42 outputs a signal to control switching of the IGBTs 30 and 31 in response to the input signal Sin of a logic level inputted through the terminal IN. Specifically, in response to the input signal Sin, the signal output circuit 42 outputs a set pulse signal S1 to turn on the high-side IGBT 30, a reset pulse signal S2 to turn off the IGBT 30, and a control signal S0 to control switching of the low-side IGBT 31.

Figure 2:
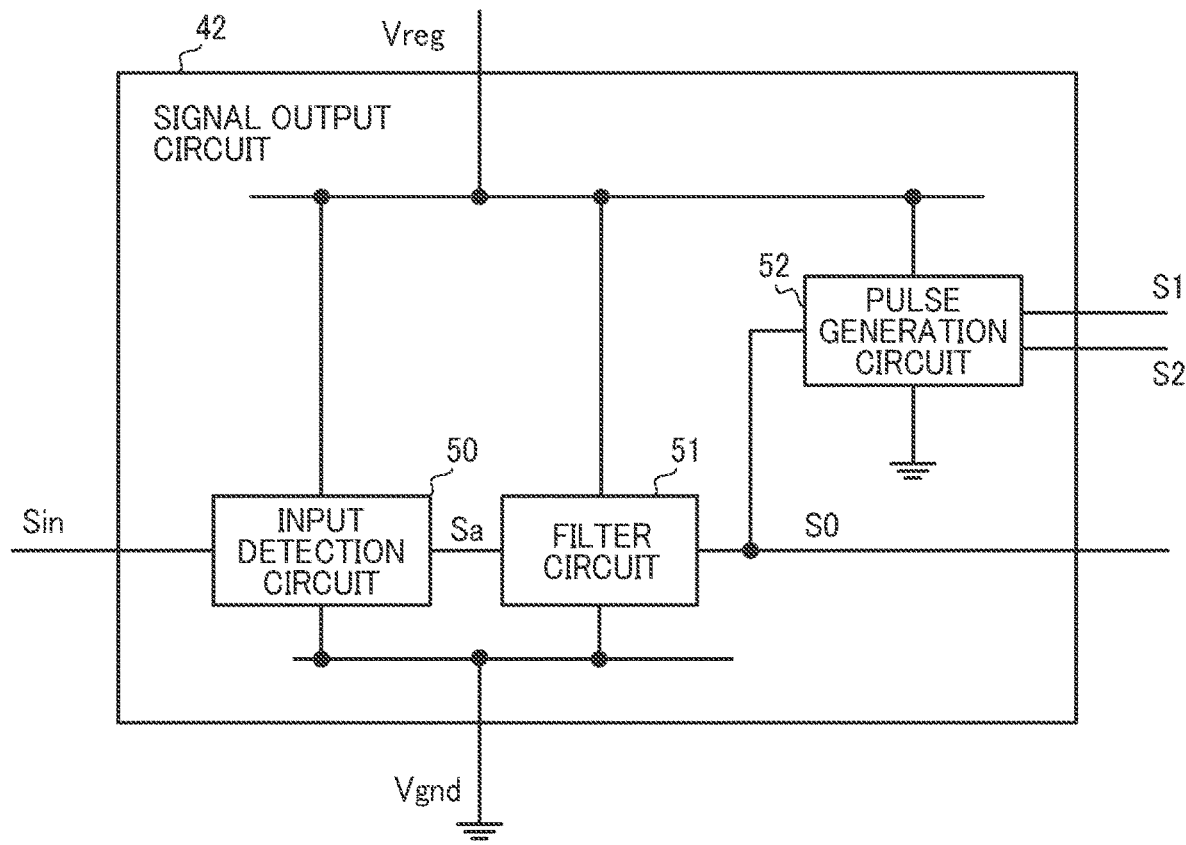
FIG. 2 is a diagram illustrating an example of a signal output circuit 42.

As illustrated in FIG. 2, the signal output circuit 42 includes an input detection circuit 50, a filter circuit 51, and a pulse generation circuit 52. The input detection circuit 50, the filter circuit 51, and the pulse generation circuit 52 operate based on the power supply voltage Vreg of the power supply circuit 40 with reference to a ground voltage Vgnd. Thus, respective nodes for grounding of the input detection circuit 50, the filter circuit 51, and the pulse generation circuit 52 are coupled to the grounded terminal GND.

The input detection circuit 50 detects the level of the input signal Sin and outputs a signal Sa at the same logic level as the logic level of the input signal Sin. Specifically, in response to the input signal Sin reaching a high level (hereinafter, referred to as high or high level), the input detection circuit 50 outputs the high signal Sa, and in response to the input signal Sin reaching a low level (hereinafter, referred to as low or low level), the input detection circuit 50 outputs the low signal Sa. The input detection circuit 50 includes a comparator (not illustrated), for example.

The filter circuit 51 is a low-pass filter to remove high-frequency noise of the signal Sa, and includes an operational amplifier (not illustrated) and the like, for example. The filter circuit 51 according to an embodiment of the present disclosure outputs a signal obtained by removing noise from the signal Sa, as the control signal S0.

The pulse generation circuit 52 outputs the set pulse signal S1 and the reset pulse signal S2 based on a change point of the control signal S0. Specifically, in response to the control signal S0 going high from low, the pulse generation circuit 52 outputs the high set pulse signal S1, and in response to the control signal S0 going low from high, the pulse generation circuit 52 outputs the high reset pulse signal S2. Each of the set pulse signal S1 and the reset pulse signal S2 according to an embodiment of the present disclosure is a pulse signal whose amplitude level changes in a range from 0 V to the level of the power supply voltage Vreg (for example, 5 V).

The level shifter circuit 43 shifts the level of each of the set pulse signal S1 and the reset pulse signal S2 to a level at which a logic circuit (described later) of the driver circuit 45 is operable. Specifically, the level shifter circuit 43 shifts the level of the set pulse signal S1, and outputs a set pulse signal S3 with an amplitude level of several tens of volts with reference to the voltage Vs which serves as a high-side reference potential, for example. The level shifter circuit 43 shifts the level of the reset pulse signal S2 and outputs a reset pulse signal S4 with an amplitude level of several tens of volts, for example, with reference to voltage Vs.

The driver circuit 44 drives the low-side IGBT 31 in response to the control signal S0. Specifically, the driver circuit 44 outputs a high driving signal Vdr1 to the gate electrode of the IGBT 31 through the terminal LO in response to the low control signal S0. As a result, the IGBT 31 is turned on. On the other hand, the driver circuit 44 outputs a low driving signal Vdr1 to the gate electrode of the IGBT 31 through the terminal LO in response to the high control signal S0. As a result, the IGBT 31 is turned off. The driver circuit 44 operates based on the power supply voltage Vcc.

Figure 3:
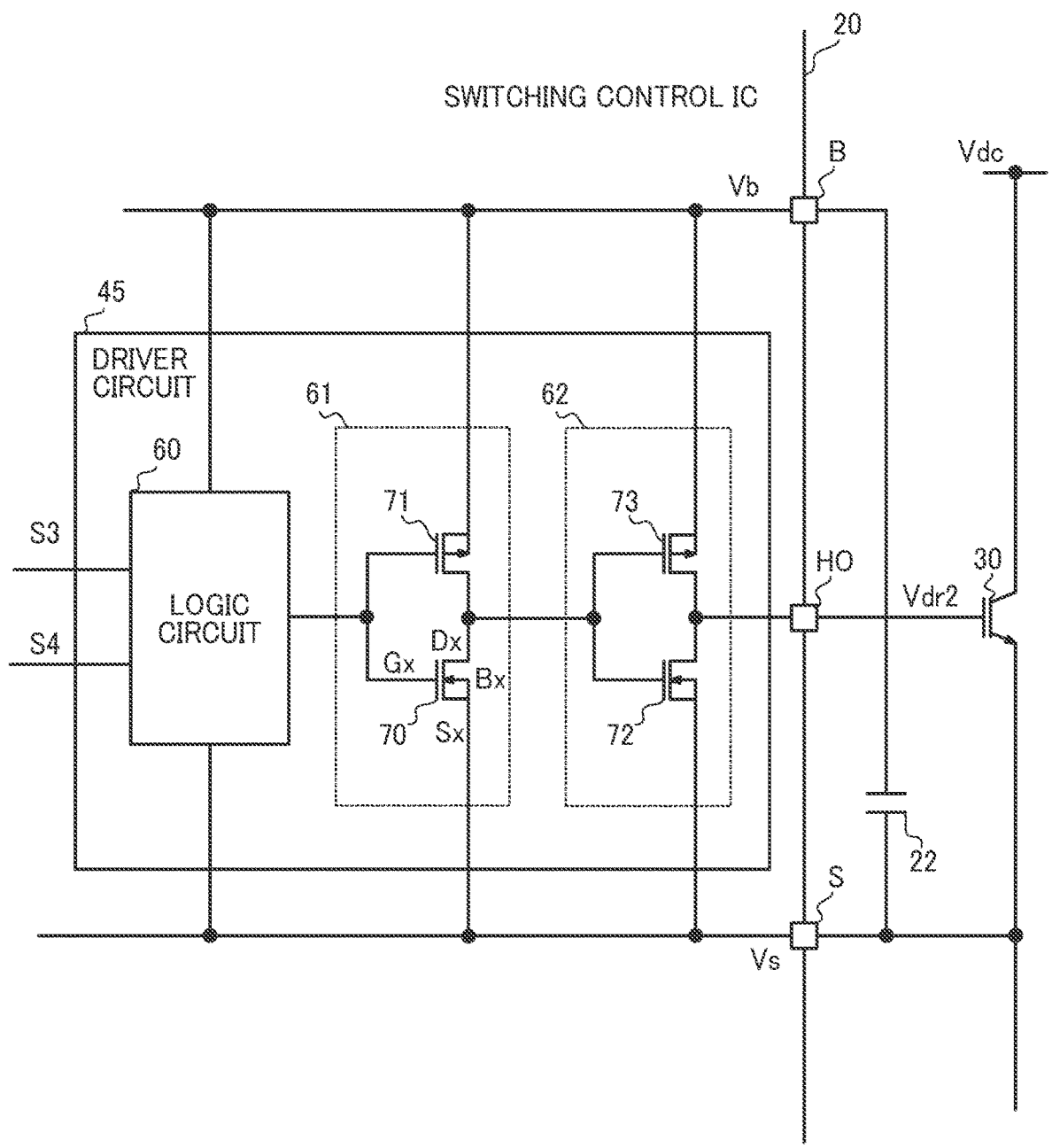
FIG. 3 is a diagram illustrating an example of a driver circuit 45.

The driver circuit 45 turns on the high-side IGBT 30 in response to the set pulse signal S3, and turns off the IGBT 30 in response to the reset pulse signal S4. FIG. 3 is a diagram illustrating an example of the driver circuit 45. The driver circuit 45 includes a logic circuit 60 and inverters 61 and 62.

The logic circuit 60 outputs a high signal upon receiving the set pulse signal S3, and outputs a low signal upon receiving the reset pulse signal S4. The logic circuit 60 includes a MOS transistor and a latch circuit that are not illustrated, for example.

The inverter 61 is a circuit that inverts the logic level of a signal from the logic circuit 60 and outputs a resultant signal, and includes an N-channel metal-oxide-semiconductor (NMOS) transistor 70 and a P-channel metal-oxide-semiconductor (PMOS) transistor 71.

The inverter 62 is a circuit that inverts the logic level of the signal from the inverter 61 and outputs a resultant signal as the driving signal Vdr2, and includes an NMOS transistor 72 and a PMOS transistor 73.

Thus, upon receiving the set pulse signal S3, the driver circuit 45 outputs the high driving signal Vdr2 to the gate electrode of the IGBT 30 through the terminal HO. On the other hand, upon receiving the reset pulse signal S4, the driver circuit 45 outputs the low driving signal Vdr2 to the gate electrode of the IGBT 30 through the terminal HO.

In this case, the driving signal Vdr2 changes the logic level thereof with reference to the voltage Vs at the terminal S. Thus, the IGBT 30 is turned on in response to the high driving signal Vdr2 and is turned off in response to the low driving signal Vdr2. The driver circuit 45 corresponds to a "driver circuit", the set pulse signal S3 corresponds to a "set signal", and the reset pulse signal S4 corresponds to a "reset signal".

<<<Operations of Switching Control IC 20>>>

Figure 4:
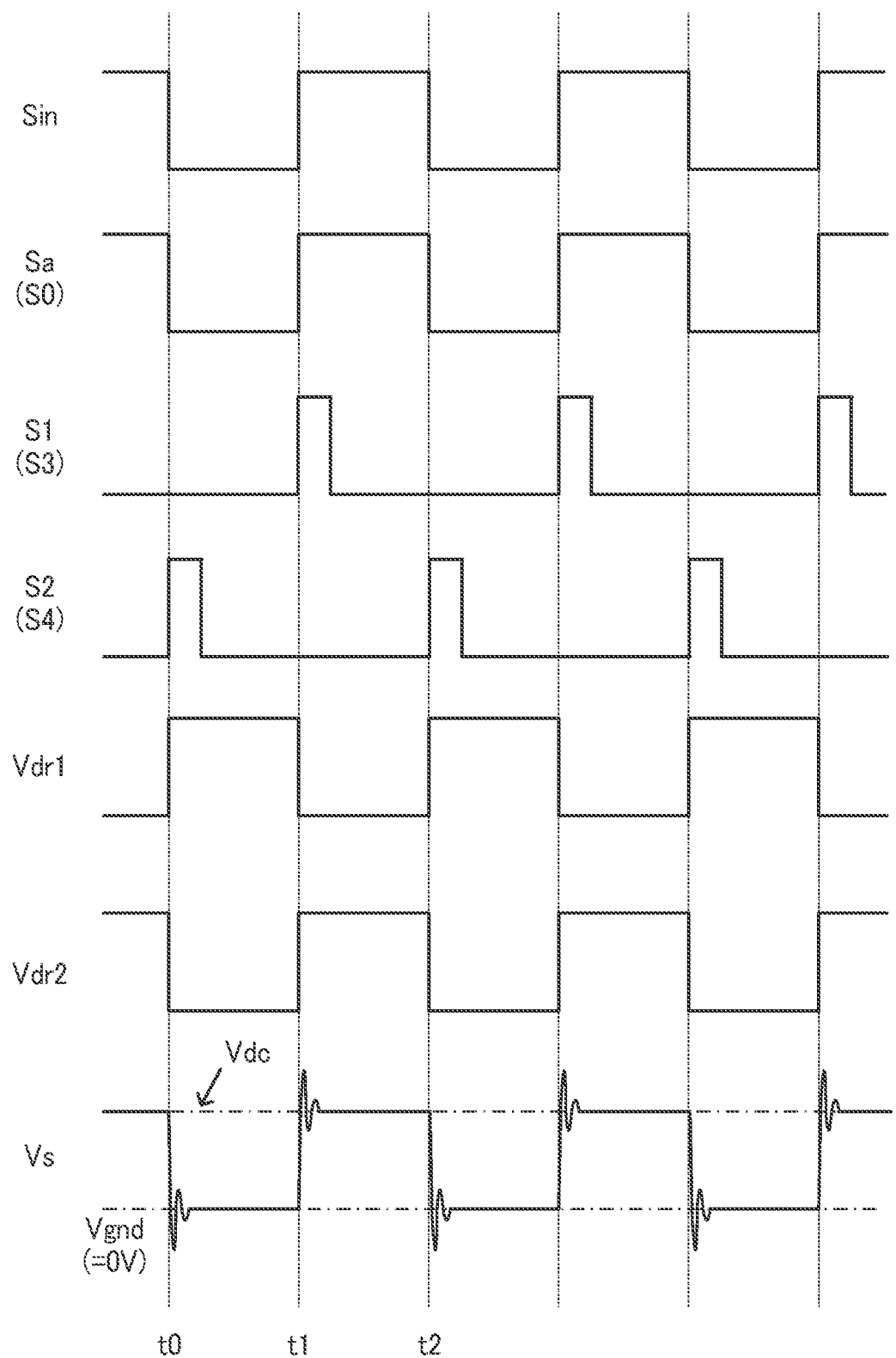
FIG. 4 is a diagram for describing an operation of a switching control IC 20.

FIG. 4 is a diagram for describing an operation of the switching control IC 20. The signal output circuit 42 according to an embodiment of the present disclosure is designed such that a delay time of a signal therein is sufficiently short.

First, in response to the input signal Sin going low at time t0, the input detection circuit 50 in FIG. 2 outputs the signal Sa that is also low. The filter circuit 51 then removes the noise (not illustrated) of the signal Sa, and outputs the control signal S0 at the same logic level as that of the signal Sa.

In response to the control signal S0 going low, the pulse generation circuit 52 outputs the high reset pulse signal S2. As a result, the level-shifted high reset pulse signal S4 is outputted from the level shifter circuit 43.

The low-side driver circuit 44 then causes the driving signal Vdr1 to be high in response to the low control signal S0, and the high-side driver circuit 45 causes the driving signal Vdr2 to be low in response to the high reset pulse signal S4.

As a result, the IGBT 30 is turned off, and the IGBT 31 is turned on, to thereby lower the voltage Vs from the voltage Vdc (for example, "400 V") to the voltage Vgnd (in this case, "0 V"). As described above, wiring for supplying power to the load 11 is provided to couple between the terminal S and the load 11. The load 11 is, for example, a motor coil with a large inductance value. Thus, upon turning on of the IGBT 31, ringing occurs in the voltage Vs, and the voltage Vs becomes a negative voltage smaller than the voltage Vgnd.

In response to the input signal Sin going high at time t1, the input detection circuit 50 outputs the signal Sa that is also high. The filter circuit 51 then removes the noise (not illustrated) of the signal Sa, and outputs the control signal S0 at the same logic level as that of the signal Sa.

In response to the control signal S0 going high, the pulse generation circuit 52 outputs the high set pulse signal S1. As a result, the level-shifted high set pulse signal S3 is outputted from the level shifter circuit 43.

The low-side driver circuit 44 causes the driving signal Vdr1 to be low in response to the high control signal S0, and the high-side driver circuit 45 causes the driving signal Vdr2 to be high in response to the high set pulse signal S3.

As a result, the IGBT 30 is turned on, and the IGBT 31 is turned off, to thereby raise the voltage Vs from the voltage Vgnd (in this case, "0 V") to the voltage Vdc (for example, "400 V"). As described above, the load 11 is coupled to the terminal S through the wiring, and thus upon turning on of the IGBT 30, ringing occurs in the voltage Vs, and the voltage Vs exceeds the voltage Vdc. The operation from time t0 to time t1 is repeated from time t2.

<<<Semiconductor Substrate 100>>>

As described above, in an embodiment of the present disclosure, upon turning on of the IGBT 31, the voltage Vs drops below the voltage Vgnd resulting in a negative voltage ("Vs"<"0 V"). In response to the voltage Vs becoming a negative voltage, a "leakage current" flows from the GND terminal to the terminal S through a semiconductor substrate in which the switching control IC 20 is formed.

Figure 5:
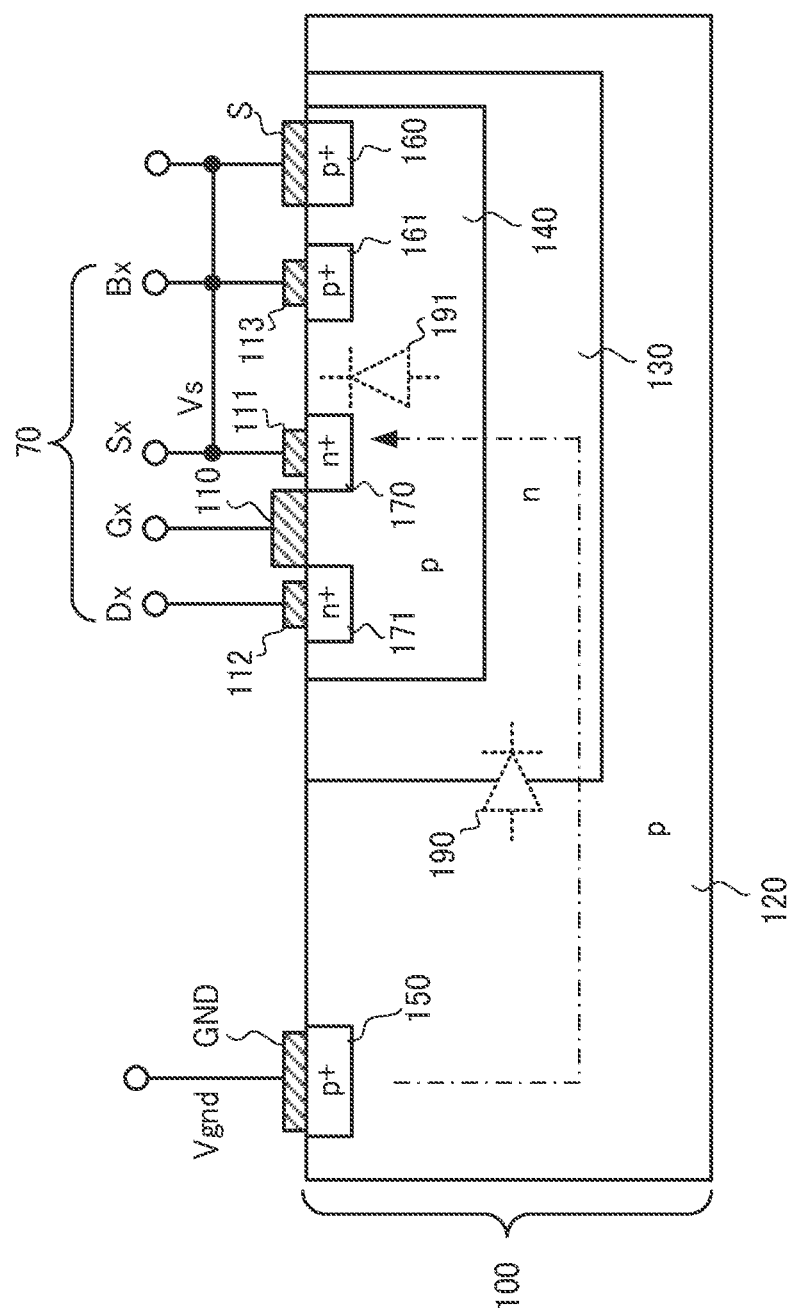
FIG. 5 is a diagram illustrating an example of a semiconductor substrate in which a switching control IC 20 is formed.

FIG. 5 is a diagram for describing a semiconductor substrate 100 in which the switching control IC 20 is formed. FIG. 5 illustrates only a partial configuration for describing the "leakage current" in the circuits and terminals of the switching control IC 20, for the sake of convenience. Specifically, FIG. 5 illustrates the terminals GND and S and the NMOS transistor 70 of the high-side driver circuit 45.

The semiconductor substrate 100 is, for example, a p-type substrate made of silicon, and the terminals GND and S and a gate electrode 110, a source electrode 111, a drain electrode 112, and a substrate electrode 113 of the NMOS transistor 70 are formed on the front side of the substrate.

In this case, the terminals GND and S and the electrodes of the NMOS transistor 70 are made of, for example, a conductive material such as polysilicon and a metallic electrode.

The electrodes of the NMOS transistor 70 are given reference numerals that are different between FIGS. 3 and 5, for the sake of convenience, however, the gate electrode 110 of the NMOS transistor 70 corresponds to a "gate electrode Gx", the source electrode 111 thereof corresponds to a "source electrode Sx", the drain electrode 112 thereof corresponds to a "drain electrode Dx", and the substrate electrode 113 thereof corresponds to a "substrate electrode Bx".

Inside the semiconductor substrate 100, there are formed a semiconductor region 120, a p-type well region 140, an n-type well region 130, p+-type contact regions 150, 160, and 161, an n+-type source region 170, and an n+-type drain region 171, which are formed of the semiconductor substrate 100. Hereinafter, when an n+-type or a p+-type is given, it means that a doping concentration thereof is higher than that of an n-type or a p-type.

The well region 130 and the contact region 150 are formed on a front surface side of the semiconductor region 120. The terminal GND is formed on a front surface of the contact region 150.

The well region 130 includes n-type impurities such as phosphorus, for example, and the p-type well region 140 is formed on a front surface side of the well region 130.

The well region 140 includes p-type impurities, and the contact regions 160 and 161, the source region 170, and the drain region 171 are formed on a front surface side of the well region 140.

The terminal S is formed in the contact region 160, and the substrate electrode 113 ("Bx") of the NMOS transistor 70 is formed in the contact region 161.

The source electrode 111 ("Sx") is formed in the source region 170, and the drain electrode 112 ("Dx") is formed in the drain region 171. The gate electrode 110 ("Gx") is formed on the front surface side of the well region 140 between the source region 170 and the drain region 171.

In an embodiment of the present disclosure, the terminal GND (corresponding to a first terminal) is electrically coupled to the semiconductor region 120 through the contact region 150, the terminal S (corresponding to a second terminal) is electrically coupled to the well region 140 through the contact region 160, and the substrate electrode 113 ("Bx") is also electrically coupled to the well region 140 through the contact region 161.

In the semiconductor substrate 100 as such, a diode 190 is formed between the p-type semiconductor region 120 and the n-type well region 130 as a parasitic diode. A diode 191 is formed between the p-type well region 140 and the n+-type source region 170 as a parasitic diode.

Thus, for example, in response to the voltage Vs dropping below the voltage Vgnd ("0 V") resulting in a negative voltage upon turning on of the IGBT 31, the source electrode 111 ("Sx") of the NMOS transistor 70 coupled to the terminal S also results in a negative voltage. As a result, the diodes 190 and 191 are turned on, and the "leakage current" flows from the terminal GND to the terminal S through a path indicated by the dashed-dotted line in FIG. 5.

In response to such "leakage current" flowing from the terminal GND to the terminal S, a current flowing to the signal output circuit 42, for example, illustrated in FIG. 1, which is coupled to the terminal GND such that the voltage Vgnd is a ground voltage, also increases. As a result, the power supply voltage Vreg greatly drops, and the signal output circuit 42 may not operate normally.

It is preferable that the power supply circuit 40 starts up in a short time upon receiving the power supply voltage Vcc from the outside the switching control IC 20 and outputs a stable power supply voltage Vreg irrespective of a variation in the power supply voltage Vcc. Thus, in an embodiment of the present disclosure, the power supply circuit 40 that has a short start-up time and stably outputs the power supply voltage Vreg even when the voltage Vs becomes a negative voltage or when the power supply voltage Vcc varies.

The semiconductor region 120 according to an embodiment of the present disclosure corresponds to a "first region", and the well region 130 corresponds to a "second region". The well region 140 corresponds to a "third region", and the source region 170 corresponds to a "fourth region". In this case, the path of the "leakage current" is described using the NMOS transistor 70 as an example, however, another device of the driver circuit (for example, the NMOS transistor 72) also generates the "leakage current", similarly.

<<<Example of Power Supply Circuit 40a>>>

Figure 6:
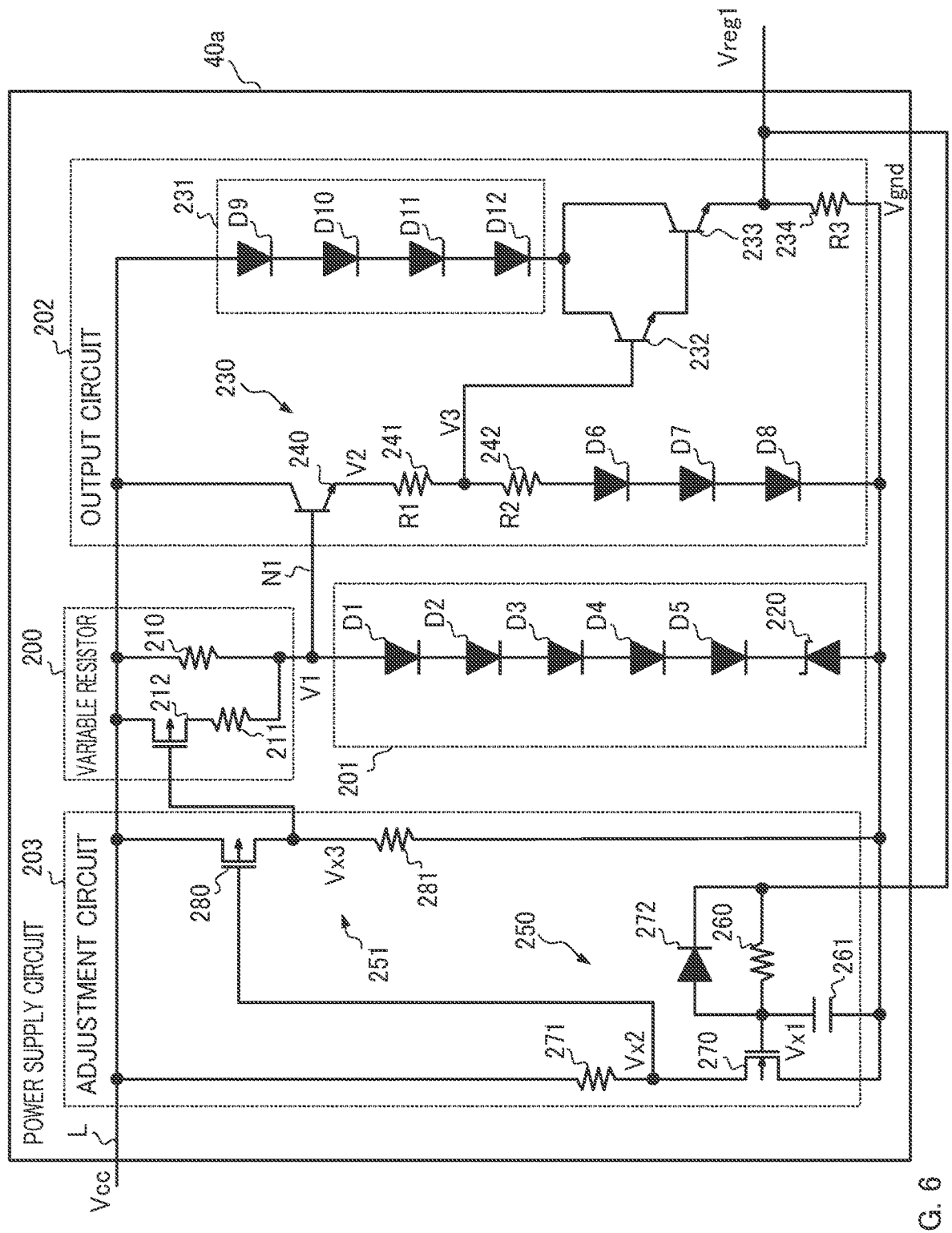

FIG. 6 is a diagram illustrating a power supply circuit 40a according to an embodiment of the configuration of the power supply circuit 40. The power supply circuit 40a generates a temperature-compensated power supply voltage Vreg1 (for example, "5 V") based on the power supply voltage Vcc. The power supply circuit 40a includes a variable resistor 200, a voltage generation circuit 201, an output circuit 202, and an adjustment circuit 203. The power supply voltage Vcc according to an embodiment of the present disclosure corresponds to an "input voltage", and the power supply voltage Vreg1 corresponds to an "output voltage".

==Variable Resistor 200==

The variable resistor 200 determines a value of a start-up current for starting up the power supply circuit 40a, and is provided between a wiring L that receives the power supply voltage Vcc and an input node N1 of the output circuit 202. The variable resistor 200 is a circuit in which the resistance value thereof changes in response to an output from the adjustment circuit 203, and includes resistors 210 and 211 and a PMOS transistor 212.

The resistor 210 has one end coupled to the wiring L, and the other end coupled to the input node N1. The resistor 211 and the PMOS transistor 212 coupled in series are coupled in parallel with the resistor 210. Thus, in response to turning off of the PMOS transistor 212, the resistance value of the variable resistor 200 increases, and in response to turning on of the PMOS transistor 212, the resistance value of the variable resistor 200 decreases.

In an embodiment of the present disclosure, the resistance value of the variable resistor 200 when the PMOS transistor 212 is off (that is, a value of the resistor 210) is referred to as a resistance value Ra, and the resistance value of the variable resistor 200 when the PMOS transistor 212 is on (that is, a value of the combined resistor of the resistors 210 and 211) is referred to as a resistance value Rb. In this case, an on-resistance of the PMOS transistor 212 is sufficiently smaller than the resistance value of the resistor 211, and the resistance value of the resistor 211 is sufficiently smaller than the resistance value of the resistor 210. Accordingly, in an embodiment of the present disclosure, the resistance value Ra is the value of the resistor 210, and the resistance value Rb is substantially the resistance value of the resistor 211.

The input node N1 corresponds to a "predetermined node", the resistor 210 corresponds to a "first resistor", the resistor 211 corresponds to a "second resistor", and the PMOS transistor 212 corresponds to a "switch".

==Voltage Generation Circuit 201==

The voltage generation circuit 201 applies a voltage V1 at a predetermined level to the input node N1 upon receiving a current from the variable resistor 200, and includes five diodes D1 to D5 and a Zener diode 220. Note that the diodes D1 to D5 correspond to a "second diode".

The variable resistor 200, the diodes D1 to D5, and the Zener diode 220 are coupled in series. Thus, when the power supply voltage Vcc is applied to the wiring L and the current flows from the variable resistor 200, the voltage V1 at the input node N1 is given by an expression (1) as follows.

$$V1 = Vz + 5 \times Vf \qquad (1)$$

where "Vz" is a breakdown voltage of the Zener diode 220, and "Vf" is a forward voltage of the diodes D1 to D5.

==Output Circuit 202==

The output circuit 202 outputs the power supply voltage Vreg1 based on the voltage V1 at the input node N1, and includes a bias voltage generation circuit 230, a withstand voltage circuit 231, NPN transistors 232 and 233, and a resistor 234.

The bias voltage generation circuit 230 generates a bias voltage V3 based on the voltage V1 at the input node N1, and includes an NPN transistor 240, resistors 241 and 242, and three diodes D6 to D8.

The NPN transistor 240 has a base electrode to receive the voltage V1, and an emitter electrode to which the diodes D6 to D8 are coupled through the resistors 241 and 242. Thus, a voltage V2 given by an expression (2) below is outputted from the emitter electrode of the NPN transistor 240.

$$V2 = V1 - Vbe = Vz + 5 \times Vf - Vbe \qquad (2)$$

where "Vbe" is a base-emitter voltage of the NPN transistor 240. In the bias voltage generation circuit 230, a voltage difference between a forward voltage "3×Vf" of the three diodes D6 to D8 and the voltage V2 is divided by a voltage divider circuit configured with the resistors 241 and 242. Thus, the bias voltage V3 from a node at which the resistors 241 and 242 are coupled is given by an expression (3) as follows.

$$V3 = 3 \times Vf + (V2 - 3 \times Vf) \times (R2/(R1+R2)) = \quad (3)$$
$$3 \times Vf + (Vz + 2 \times Vf - Vbe) \times (R2/(R1+R2))$$

where "R1" is a resistance value of the resistor 241, and "R2" is a resistance value of the resistor 242.

The withstand voltage circuit 231 protects the NPN transistors 232 and 233 from an overvoltage, and includes four diodes D9 to D12 coupled in series.

An emitter electrode of the NPN transistor 232 is coupled to a base electrode of the NPN transistor 233, and a collector electrode of the NPN transistor 232 is coupled to a collector electrode of the NPN transistor 233. Accordingly, the NPN transistors 232 and 233 according to an embodiment of the present disclosure are darlington-coupled, and thus can drive a larger load. Note that each of the NPN transistors 232 and 233 corresponds to a "second transistor".

As described above, the voltage V3 is applied to the base electrode in the NPN transistor 232 in a first stage, and thus the power supply voltage Vreg1 given by an expression (4) below is outputted from the emitter electrode of the NPN transistor 233.

$$Vreg1 = \quad (4)$$
$$V3 - 2 \times Vbe = (3 \times Vf + (Vz + 2 \times Vf - Vbe) \times (R2/(R1+R2)) - 2 \times Vbe$$

The resistor 234 is an element for steadily generating the power supply voltage Vreg1. Specifically, when no resistor 234 is provided, the current flowing through the NPN transistors 232 and 233 reaches zero, in response to the state of the load of the power supply circuit 40a becoming no load. Thus, the generation of the power supply voltage Vreg1 is stopped.

If the current starts flowing through the load of the power supply circuit 40a in this state, it takes time for the power supply circuit 40a to generate the power supply voltage Vreg1.

In an embodiment of the present disclosure, even when the state of the load of the power supply circuit 40a is no load, the current continue to flow through the resistor 234. Thus, the power supply circuit 40a can steadily generate a predetermined power supply voltage Vreg1 irrespective of the state of the load of the power supply circuit 40a.

A temperature coefficient of the breakdown voltage "Vz" of the Zener diode 220 is positive, and a temperature coefficient of the forward voltage "Vf" of the diodes D1 to D12 is negative. A temperature coefficient of the base-emitter voltage "Vbe" is negative.

In an embodiment of the present disclosure, the same type of resistors (for example, polysilicon) with the same temperature coefficient are used as the resistors 241 and 242. Accordingly, the temperature coefficient of the term "R2/(R1+R2)" in the expression (4) can be substantially ignored.

In an embodiment of the present disclosure, for example, the number of the diodes D1 to D12 is adjusted based on the expression (4) such that the power supply voltage Vreg1 is temperature-compensated. Accordingly, the level of the power supply voltage Vreg1 is constant irrespective of the temperature. In an embodiment of the present disclosure, it is possible to cause the power supply voltage Vreg1 to be a desired level by changing the resistance ratio of the resistors 241 and 242.

As such, the power supply circuit 40a includes the darlington-coupled NPN transistors 232 and 233, and thus the output current capability is high. Further, the power supply circuit 40a can output the temperature-compensated power supply voltage Vreg1 at a predetermined level (for example, "5 V").

==Adjustment Circuit 203==

The adjustment circuit 203 adjusts the resistance value of the variable resistor 200 based on the power supply voltage Vreg1. Specifically, in response to stopping the generation of the power supply voltage Vreg1, the adjustment circuit 203 reduces the resistance value of the variable resistor 200. On the other hand, in response to a predetermined time period T having elapsed since start of the generation of the power supply voltage Vreg1, the adjustment circuit 203 increases the resistance value of the variable resistor 200.

The adjustment circuit 203 includes a detection circuit 250 and a control circuit 251. The detection circuit 250 detects whether the predetermined time period T has elapsed since start of the generation of the power supply voltage Vreg1, and includes resistors 260 and 271, a capacitor 261, an NMOS transistor 270, and a diode 272. In an embodiment of the present disclosure, the resistor 260 corresponds to a "third resistor", the NMOS transistor 270 corresponds to a "first transistor", and the diode 272 corresponds to a "first diode".

The resistor 260 and the capacitor 261 configure an integrator circuit that integrates the power supply voltage Vreg1. A gate electrode of the NMOS transistor 270 is coupled to a node at which the resistor 260 and the capacitor 261 are coupled. The NMOS transistor 270 and the resistor 271 configure an inverter. Accordingly, when a charge voltage Vx1 of the capacitor 261 is smaller than a threshold voltage Vth of the NMOS transistor 270, a voltage Vx2, which is an output from the inverter, goes high. On the other hand, in response to the charge voltage Vx1 exceeding the threshold voltage Vth of the NMOS transistor 270, the voltage Vx2 goes low.

The diode 272 discharges the capacitor 261 in response to stopping the generation of the power supply voltage Vreg1 and lowering the power supply voltage Vreg1, for example. Details of an operation of the diode 272 will be described later.

The control circuit 251 controls turning on and off of the PMOS transistor 212 in the variable resistor 200 based on the voltage Vx2. The control circuit 251 includes a PMOS transistor 280 and a resistor 281 that configure an inverter. Thus, for example, in response to stopping the generation of the power supply voltage Vreg1 and the voltage Vx2 going high, the control circuit 251 causes a voltage Vx3, which is an output from the inverter, to be low. As a result, the PMOS transistor 212 is turned on, and the resistance value of the variable resistor 200 results in a value of the combined resistance of the resistors 210 and 211.

On the other hand, in response to the predetermined time period T having elapsed since the generation of the power supply voltage Vreg1 is started and the voltage Vx2 going low, the control circuit 251 causes the voltage Vx3 to be high. As a result, the PMOS transistor 212 is turned off, and the resistance value of the variable resistor 200 results in the large resistance value Ra(>Rb).

For example, the values of the resistor 260 and the capacitor 261 are selected such that the predetermined time period T according to an embodiment of the present disclosure is longer than a time period from when the generation of the power supply voltage Vreg1 is started to when the level of the power supply voltage Vreg1 reaches a target level (for example, 5 V). Accordingly, in an embodiment of the present disclosure, it is possible to reliably increase the start-up current of the power supply circuit 40a such that the power supply voltage Vreg1 reaches a target level.

<<<Example of Operation of Power Supply Circuit 40a>>>

Figure 7:
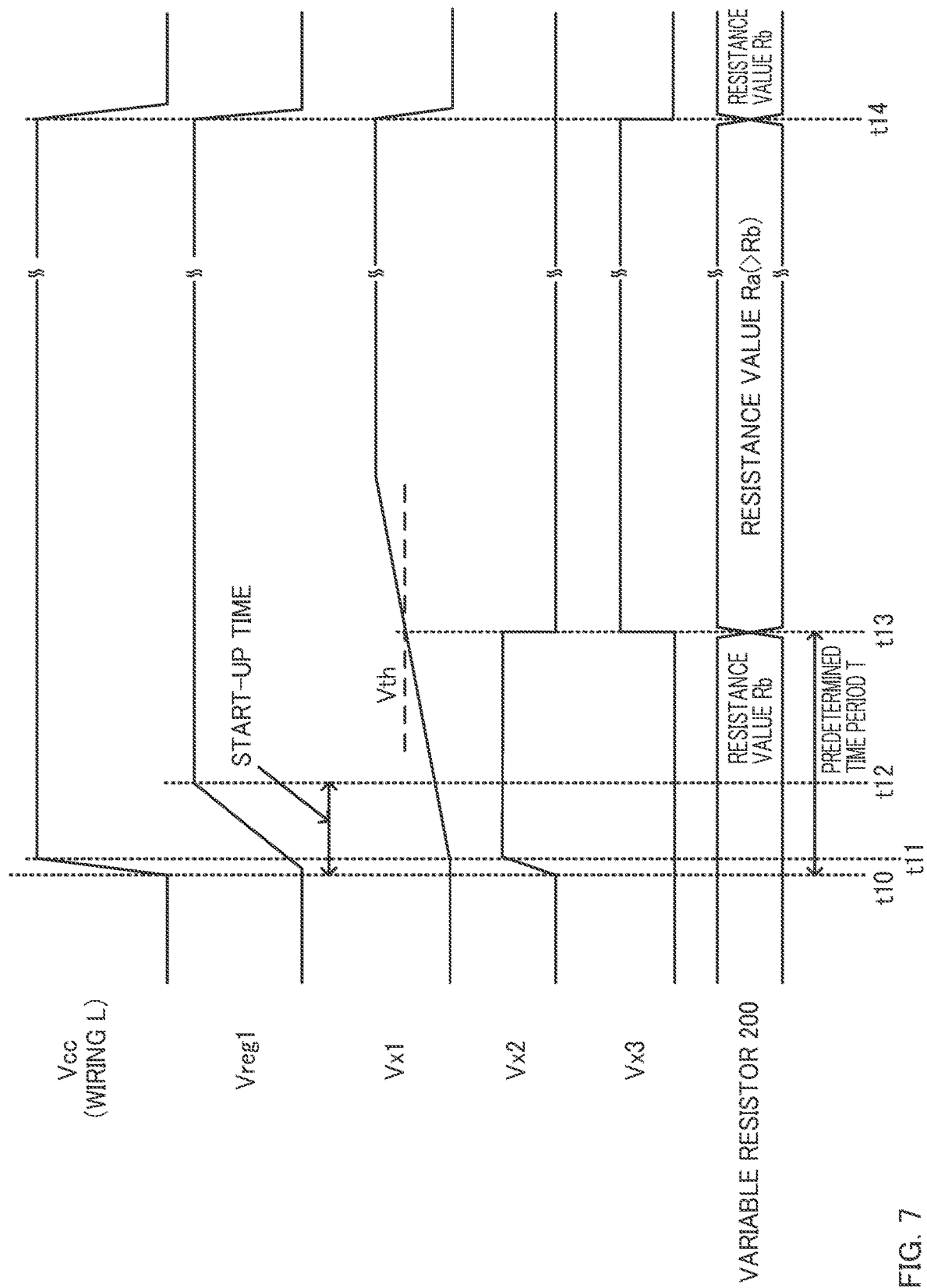

FIG. 7 is a diagram for describing an operation when the power supply voltage Vcc is supplied to thereby start up the power supply circuit 40a. First, at time t10, in response to the power supply voltage Vcc from the outside of the switching control IC 20 being supplied, the level of the power supply voltage Vcc of the wiring L rises, and the generation of the power supply voltage Vreg1 is also started. In an embodiment of the present disclosure, a "timing at which the generation of the power supply voltage Vreg1 is started" means, for example, a timing at which the power supply voltage Vcc for operating the power supply circuit 40a is applied to the wiring L (in this case, time t10).

From time t10, the level of the power supply voltage Vreg1 gradually rises. However, since the charge voltage Vx1 of the capacitor 261 is lower than the threshold voltage Vth of the NMOS transistor 270, the NMOS transistor 270 is off. In this state, when the level of the power supply voltage Vcc rises, the voltage Vx2 at the node at which the NMOS transistor 270 and the resistor 271 are coupled gradually rises as well.

For example, at time t11, in response to the level of the power supply voltage Vcc reaching a target level (for example, 20 V), the voltage Vx2 also goes high. At this point, the PMOS transistor 280 of the control circuit 251 is off, and the voltage Vx3 is low. Accordingly, in response to the PMOS transistor 212 of the variable resistor 200 becoming operable with a rise in the power supply voltage Vcc, the PMOS transistor 212 is turned on, and the resistance value of the variable resistor 200 results in the small resistance value Rb.

Since a large current is supplied from the variable resistor 200 to the darlington-coupled NPN transistors 232 and 233 through the input node N1, the power supply voltage Vreg1 rapidly rises. As a result, for example, at time t12, the level of the power supply voltage Vreg1 reaches a target level (for example, 5 V).

It is assumed in an embodiment of the present disclosure that, for example, a time period from when the generation of the power supply voltage Vreg1 is started to when the level of the power supply voltage Vreg1 reaches the target level (time period from time t10 to t12) is a "start-up time" of the power supply circuit 40a. It is also assumed that the current flowing from the wiring L to the input node N1 through the variable resistor 200 in the start-up time of the power supply circuit 40a is a "start-up current".

At time t13 at which the predetermined time period T has elapsed since time t10, the level of the voltage Vx1 reaches the threshold voltage Vth of the NMOS transistor 270, and thus the NMOS transistor 270 is turned on. As a result, the voltage Vx2 of the detection circuit 250 goes low, and the control circuit 251 causes the voltage Vx3 to go high. In response to turning off of the PMOS transistor 212, the resistance value of the variable resistor 200 results in the large resistance value Ra(>Rb). Thus, line regulation of the power supply circuit 40a is improved as compared with the case of the resistance value Rb. Details will be described later.

In response to stopping the supply of the power supply voltage Vcc at time t14, the level of the power supply voltage Vreg1 also drops rapidly, and eventually the generation of the power supply voltage Vreg1 is stopped as well. As a result, the level of the power supply voltage Vreg1 also drops rapidly. In this case, the diode 272 has a cathode electrode coupled to the emitter electrode of the NPN transistor 233, which is an output node of the power supply circuit 40a, and an anode electrode coupled to the capacitor 261. Accordingly, with a reduction in the power supply voltage Vreg1, the diode 272 is turned on, to thereby discharge the capacitor 261.

In response to the capacitor 261 being discharged, the charge voltage Vx1 drops to a voltage that is lower than the threshold voltage Vth (for example, substantially 0 V), and thus the NMOS transistor 270 is turned off. As a result, the node at which the NMOS transistor 270 and the resistor 271 are coupled is pulled up to the power supply voltage Vcc through the resistor 271, and thus the PMOS transistor 280 is turned off.

In this state, in response to the supply of the power supply voltage Vcc being resumed, for example, the voltage Vx2 goes high, and the voltage Vx3 goes low, and thus, the PMOS transistor 212 of the variable resistor 200 is turned on. Hence, in FIG. 7, at time t14, which is a timing at which the supply of the power supply voltage Vcc is stopped, the adjustment circuit 203 can set the resistance value of the variable resistor 200 to the small resistor Rb. Accordingly, in an embodiment of the present disclosure, the start-up current of the power supply circuit 40a can be increased, upon receipt of the power supply voltage Vcc.

<<<Start-Up Time>>>

Figure 8:
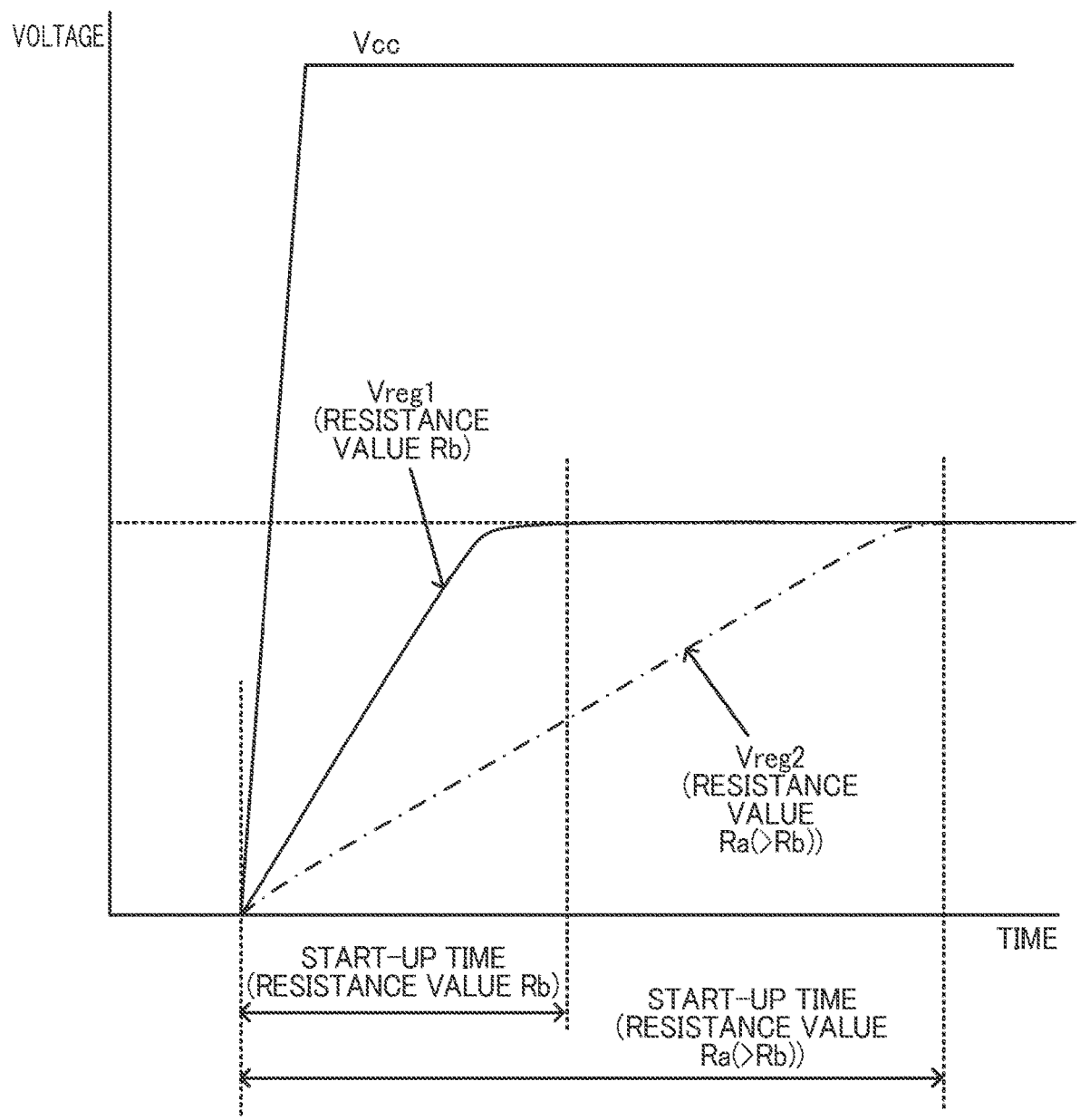

FIG. 8 is a diagram for describing a relationship between the resistance value of the variable resistor 200 and the start-up time. As described above, in an embodiment of the present disclosure, the resistance value of the variable resistor 200 when the power supply circuit 40a starts up is the small resistance value Rb, and thus a waveform of the power supply voltage Vreg1 results in the waveform indicated by the solid line in FIG. 8.

For instance, if the resistance value of the variable resistor 200 when the power supply circuit 40a starts up is the large resistance value Ra (>Rb), the value of the start-up current decreases. As a result, in the power supply circuit 40a in FIG. 6, the current that is supplied from the wiring L to the darlington-coupled NPN transistor 232 through the variable resistor 200, the input node N1, the NPN transistor 240, and the resistor 241 also decreases. In such a case, the start-up time of the power supply voltage Vreg1 increases as indicated by the waveform given by the dashed-dotted line in FIG. 8. In an embodiment of the present disclosure, the resistance value of the variable resistor 200 when the power supply circuit 40a starts up is the small resistance value Rb, thereby being able to reduce the start-up time of the power supply circuit 40a.

<<<Line Regulation>>>

Figure 9:
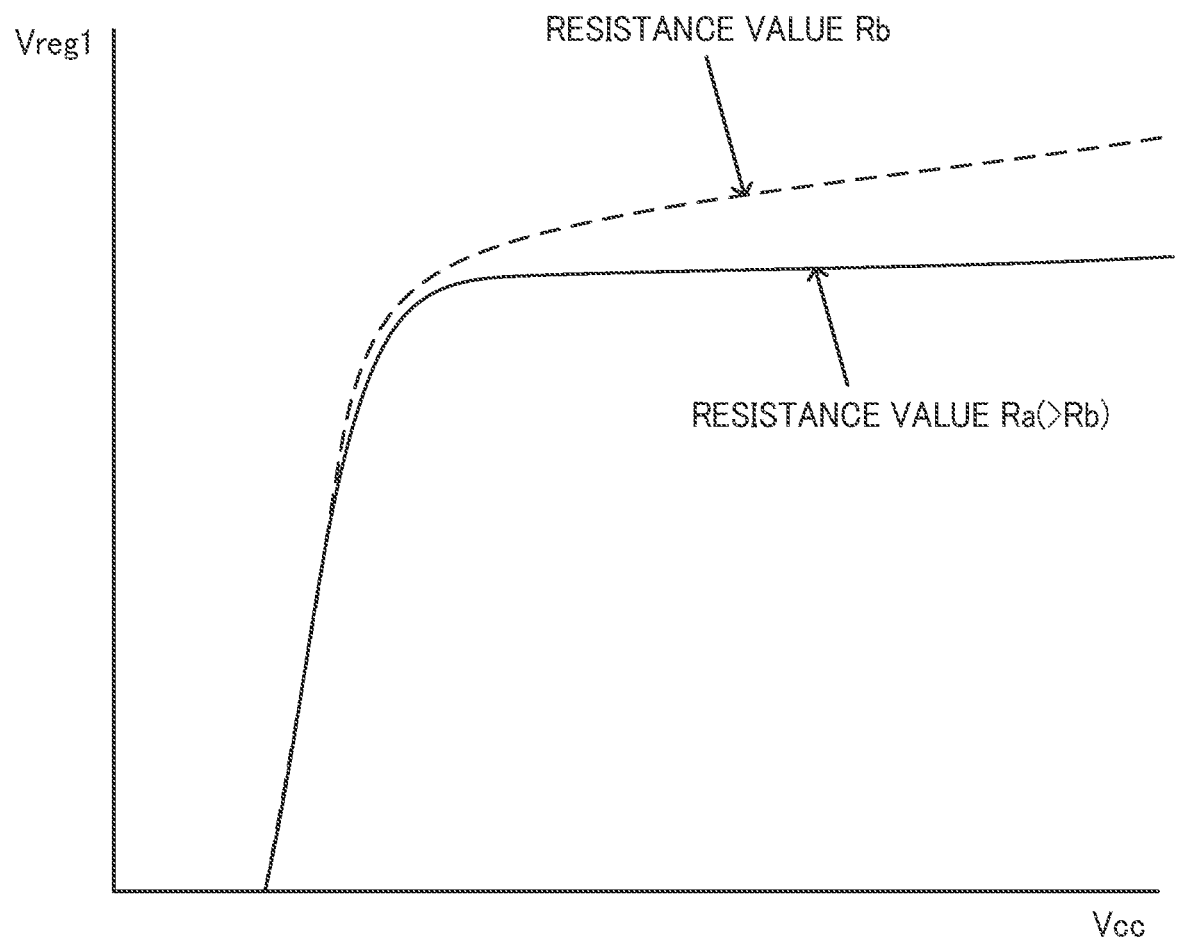

FIG. 9 is a diagram illustrating a relationship between the resistance value of the variable resistor 200 and the line regulation of the power supply circuit 40a. As described with the above expressions (1) to (4), the power supply voltage Vreg1 is affected by the voltage V1 applied to the input node N1 of the output circuit 202. The theoretical formula of the voltage V1 at the input node N1 is V1=Vz+5×Vf given by the expression (1), however, the actual diodes D1 to D5 and Zener diode 220 include a parasitic resistance. For this reason, the smaller the resistance value of the variable resistor 200 becomes, the more the actual voltage V1 is affected by the parasitic resistance of the diode D1 and the like.

Specifically, as given by the dashed line in FIG. 9, when the resistance value of the variable resistor 200 is the small resistance value Rb, the power supply voltage Vreg1 greatly rises with a rise in the power supply voltage Vcc. On the other hand, when the resistance value of the variable resistor 200 is the large resistance value Ra(>Rb), the effects of the parasitic resistance of the diode D1 and the like decrease. As a result, as given by the solid line in FIG. 9, even when the power supply voltage Vcc rises, the power supply voltage Vreg1 is substantially constant (V1=Vz+5×Vf).

In an embodiment of the present disclosure, the resistance value Ra is set to be sufficiently larger than the value of the parasitic resistance of the diode D1 and the like such that the effects of the parasitic resistance of the diode D1 and the like can be ignored. Accordingly, in response to the power supply circuit 40a starting up and the resistance value of the variable resistor 200 becoming the large resistance value Ra, as indicated at time t13 in FIG. 7, for example, the power supply circuit 40a can reduce the variation (i.e., the line regulation) in the power supply voltage Vreg1.

<<<Example of Power Supply Circuit 40b>>>

Figure 10:
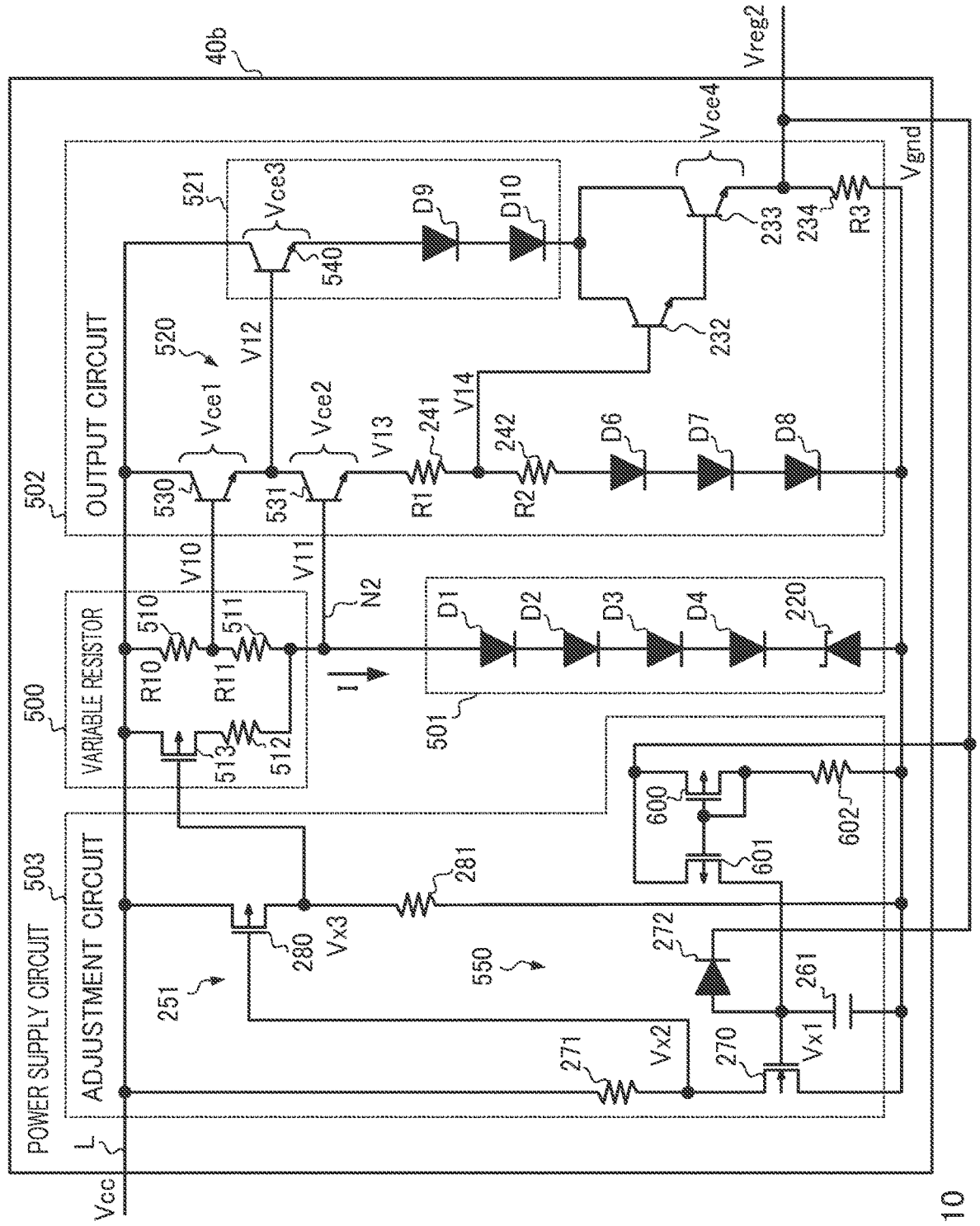
FIG. 10 is a diagram illustrating an example of a power supply circuit 40b.

FIG. 10 is a diagram illustrating a power supply circuit 40b according to another embodiment of the configuration of the power supply circuit 40. As with the power supply circuit 40a, the power supply circuit 40b generates a temperature-compensated power supply voltage Vreg2 (for example, "5 V") based on the power supply voltage Vcc. The power supply circuit 40b includes a variable resistor 500, a voltage generation circuit 501, an output circuit 502, and an adjustment circuit 503. The elements that are the same between FIGS. 6 and 10 are given the same reference numerals.

==Variable Resistor 500==

The variable resistor 500 determines a value of the start-up current for starting up the power supply circuit 40b, and is provided between the wiring L that receives the power supply voltage Vcc and an input node N2 of the output circuit 502. The variable resistor 500 is a circuit in which the resistance value thereof changes in response to an output from the adjustment circuit 503, and includes resistors 510 to 512 and a PMOS transistor 513.

The resistors 510 and 511 are coupled in series, and provided between the wiring L and the input node N2. The resistor 512 and the PMOS transistor 513 coupled in series are coupled in parallel with the resistors 510 and 511. Thus, in response to turning off of the PMOS transistor 513, the resistance value of the variable resistor 500 increases, and in response to turning on of the PMOS transistor 513, the resistance value of the variable resistor 500 decreases.

In an embodiment of the present disclosure, the resistance value of the variable resistor 500 when the PMOS transistor 513 is turned off is referred to as a resistance value Rc, and the resistance value of the variable resistor 500 when the PMOS transistor 513 is turned on is referred to as a resistance value Rd. In this case, an on-resistance of the PMOS transistor 513 is sufficiently smaller than the resistance value of the resistor 512, and the resistance value of the resistor 512 is sufficiently smaller than the resistance value of the combined resistor of the resistors 510 and 511. Accordingly, in an embodiment of the present disclosure, the resistance value Rc is the resistance value of the combined resistor of the resistors 510 and 511, and the resistance value Rd is substantially the resistance value of the resistor 512.

The input node N2 corresponds to a "predetermined node", the combined resistor of the resistors 510 and 511 corresponds to a "first resistor", the resistor 512 corresponds to a "second resistor", and the PMOS transistor 513 corresponds to a "switch".

==Voltage Generation Circuit 501==

The voltage generation circuit 501 generates a voltage V10, V11 at a predetermined level with the variable resistor 500, so as to operate the output circuit 502. The voltage generation circuit 501 includes the four diodes D1 to D4 and the Zener diode 220. The PMOS transistor 513 of the variable resistor 500 is turned off at a timing after the power supply circuit 40b starts up and the power supply voltage Vreg2 reaches a target level (for example, 5 V). Details will be described later. Thus, a state in which the PMOS transistor 513 is turned off and the variable resistor 500 is the combined resistor of the resistors 510 and 511 will be mainly described here.

The resistors 510 and 511 of the variable resistor 500, the diodes D1 to D4, and the Zener diode 220 are coupled in series. Thus, in a state in which the power supply voltage Vcc is being applied to the wiring L, a current I flowing through the resistors 510 and 511 is given by an expression (5) as follows.

$$I=(Vcc-(Vz+4\times Vf))/(R10+R11) \quad (5)$$

where "R10" is a resistance value of the resistor 510, and "R11" is a resistance value of the resistor 511. Thus, the voltage V10 at a node at which the resistors 510 and 511 are coupled is given by an expression (6):

$$V10=Vcc-R10\times I \quad (6).$$

The voltage V11 at the input node N2 at which the resistor 511 and the diode D1 are coupled is given by an expression (7):

$$V11=Vz+4\times Vf \quad (7).$$

The voltage generation circuit 501 according to an embodiment of the present disclosure includes the four diodes D1 to D4, however, if the number of the diodes increases, the level of the voltage V11 exceeds the level of the power supply voltage Vcc. Accordingly, in the voltage generation circuit 501, the number of the diodes needs to be adjusted such that the level of the voltage V11 is lower than the level of the power supply voltage Vcc.

==Output Circuit 502==

The output circuit 502 outputs the power supply voltage Vreg2 based on the voltage V11 at the input node N2, and includes a bias voltage generation circuit 520, a withstand voltage circuit 521, the NPN transistors 232 and 233, and the resistor 234.

The bias voltage generation circuit 520 generates a voltage V12, V14 at a predetermined level, and includes NPN transistors 530 and 531, the resistors 241 and 242, and the three diodes D6 to D8.

The NPN transistor 530 has a base electrode to receive the voltage V10, and an emitter electrode to which the NPN transistor 531 is coupled. Thus, the NPN transistor 530 operates as an emitter follower. Accordingly, the voltage V12 given by an expression (8) below is outputted from the emitter electrode of the NPN transistor 530. Hereinafter, a base-emitter voltage of the NPN transistors 530 and 531 is referred to as "Vbe":

$$V12=V10-Vbe \quad (8).$$

The NPN transistor 531 has a base electrode to receive the voltage V11, and an emitter electrode to which the diodes D6 to D8 are coupled through the resistors 241 and 242. Thus, the NPN transistor 531 also operates as an emitter follower.

Accordingly, a voltage V13 given by an expression (9) below is outputted from the emitter electrode of the NPN transistor 531.

$$V13 = V11 - Vbe = Vz + 4 \times Vf - Vbe \quad (9)$$

In the bias voltage generation circuit 520, a voltage difference between the forward voltage "3×Vf" of the three diodes D6 to D8 and the voltage V13 is divided by the voltage divider circuit configured with the resistors 241 and 242. Thus, the bias voltage V14 from a node at which the resistors 241 and 242 are coupled is given by an expression (10) as follows:

$$V14 = 3 \times Vf + (V13 - 3 \times Vf) \times (R2/(R1 + R2)) = \quad (10)$$
$$(3 \times Vf + (Vz + Vf - Vbe) \times (R2/(R1 + R2))).$$

The number of the diodes in the voltage generation circuit 501 is four. However, if the number of the diodes decreases, the voltages at the voltages V10 and V11 drop, and consequently, a collector-emitter voltage Vce1 of the NPN transistor 530 and a collector-emitter voltage Vce2 of the NPN transistor 531 rise.

Thus, in order to prevent the voltages Vce1 and Vce2 from exceeding respective withstand voltages thereof, the number (x) of the diodes in the voltage generation circuit 501 needs to satisfy the following condition:

$$Vcc \leq Vz + x \times Vf + (Vce1m + Vce2m) - Vbe \quad (11)$$

where voltages Vce1m and Vce2m in the expression (11) are voltage values indicating the withstand voltages of the voltages Vce1 and Vce2, respectively.

The withstand voltage circuit 521 protects the NPN transistors 232 and 233 from an overvoltage, and includes an NPN transistor 540 and two diodes D9 and D10 coupled in series. The NPN transistor 540 has a base electrode to receive the voltage V12, and an emitter electrode to which the diodes D9 and D10 are coupled. Thus, the NPN transistor 540 operates as an emitter follower.

The configuration constituted by the darlington-coupled NPN transistors 232 and 233 and the resistor 234 is the same as that in FIG. 6, and thus it is possible to drive a large load. As described above, the voltage V14 is applied to the base electrode in the NPN transistor 232 in the first stage, and thus the power supply voltage Vreg2 given by an expression (12) below is outputted from the emitter electrode of the NPN transistor 233.

$$Vreg2 = V14 - 2 \times Vbe = (3 \times Vf + (Vz + Vf - Vbe) \times (R2/(R1 + R2))) - 2 \times Vbe \quad (12)$$

Since the resistor 234 is an element for steadily generating the power supply voltage Vreg2, the power supply circuit 40b can steadily generate a predetermined power supply voltage Vreg2 irrespective of the state of the load, as with the power supply circuit 40a.

In an embodiment of the present disclosure, for example, the numbers of the diodes D1 to D4 and D6 to D8 are adjusted based on the expression (12) such that the power supply voltage Vreg2 is temperature-compensated. Accordingly, the level of the power supply voltage Vreg2 is constant irrespective of the temperature. Further, for example, it is possible to set the power supply voltage Vreg2 to a desired level by changing the resistance ratio between the resistors 241 and 242.

As such, as with the power supply circuit 40a, the power supply circuit 40b includes the darlington-coupled NPN transistors 232 and 233, and thus the output current capability is high, and it is possible to output the temperature-compensated power supply voltage Vreg2 at a predetermined level (for example, "5 V").

Further, the following condition needs to be satisfied in an embodiment of the present disclosure:

$$Vcc \leq Vf \times y + Vce3m + Vce4m + Vreg2 \quad (13)$$

where, Vce3m is the emitter-collector withstand voltage of the NPN transistor 530, Vce4m is the emitter-collector withstand voltage of the in the NPN transistor 233, and y is the number of the diodes included in the withstand voltage circuit 521.

As such, in an embodiment of the present disclosure, even when the level of the power supply voltage Vcc is high, it is possible to appropriately protect the darlington-coupled NPN transistors 232 and 233, by adjusting the number of the diodes in the withstand voltage circuit 521, for example.

==Adjustment Circuit 503==

The adjustment circuit 503 adjusts the resistance value of the variable resistor 500 based on the power supply voltage Vreg2. Specifically, in response to stopping the generation of the power supply voltage Vreg2, the adjustment circuit 503 reduces the resistance value of the variable resistor 500. On the other hand, in response to the predetermined time period T having elapsed since the generation of the power supply voltage Vreg2 is started, the adjustment circuit 503 increases the resistance value of the variable resistor 500.

The adjustment circuit 503 uses a current mirror circuit (described later) that charges the capacitor 261 instead of the resistor 260 of the adjustment circuit 203 in FIG. 6, and includes a detection circuit 550 and the control circuit 251.

The detection circuit 550 detects whether the predetermined time period T has elapses since the generation of the power supply voltage Vreg2 is started, and includes PMOS transistors 600 and 601, resistors 271 and 602, the capacitor 261, an NMOS transistor 270, and a diode 272. When comparing the adjustment circuit 203 and the adjustment circuit 503, the configurations thereof are the same except the PMOS transistors 600 and 601 and the resistor 602. Thus, the PMOS transistors 600 and 601 and the resistor 602 will be mainly described here.

The PMOS transistors 600 and 601 and the resistor 602 configure the "current mirror circuit" that operates based on the power supply voltage Vreg2. Accordingly, in response to the power supply voltage Vreg2 rising, for example, to a target level, the PMOS transistor 601 outputs a predetermined current. In an embodiment of the present disclosure, the size ratio between the PMOS transistors 600 and 601 is adjusted such that a current of the PMOS transistor 601 is smaller than a current of the PMOS transistor 600.

The value of the current from the PMOS transistor 601 is set such that the predetermined time period T from when the capacitor 261 is charged to when the charge voltage Vx1 reaches the threshold voltage of the NMOS transistor 270 is longer than the start-up time of the power supply voltage Vreg2. Accordingly, in an embodiment of the present disclosure, it is possible to reliably increase the start-up current of the power supply circuit 40b such that the power supply voltage Vreg2 reaches a target level.

As with the adjustment circuit 203, when the power supply circuit 40b starts up, the adjustment circuit 503 sets the resistance value of the variable resistor 500 to the small resistance value Rc, and when the predetermined time period T has elapsed since the generation of the power supply voltage Vreg2 is started, the adjustment circuit 503 sets the resistance value of the variable resistor 500 to the large resistance value Rd. Accordingly, as with the power supply circuit 40*a*, it is possible to improve the line regulation of the power supply circuit 40*b*.

<<<Example of Power Supply Circuit 40*c*>>>

Figure 11:
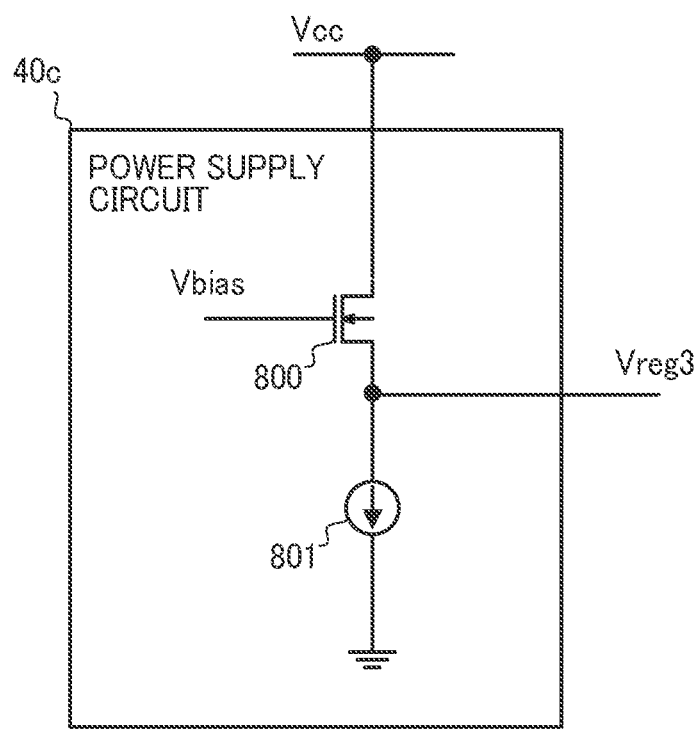
FIG. 11 is a diagram illustrating an example of a power supply circuit 40c.

FIG. 11 is a diagram illustrating an example of a power supply circuit 40*c* according to another embodiment of the power supply circuit 40. In this case, the power supply circuit 40*c* has an output current capability smaller than the output current capability of the power supply circuit 40*a*. The power supply circuit 40*c* includes an NMOS transistor 800 and a current source 801.

The NMOS transistor 800 and the current source 801 configure a source follower. Thus, a power supply voltage Vreg3 corresponding to a bias voltage Vbias that is applied to a gate electrode of the NMOS transistor 800 is outputted from a source electrode of the NMOS transistor 800.

<<<Example of Waveform when IGBT 31 is Turned On>>>

Figure 12:
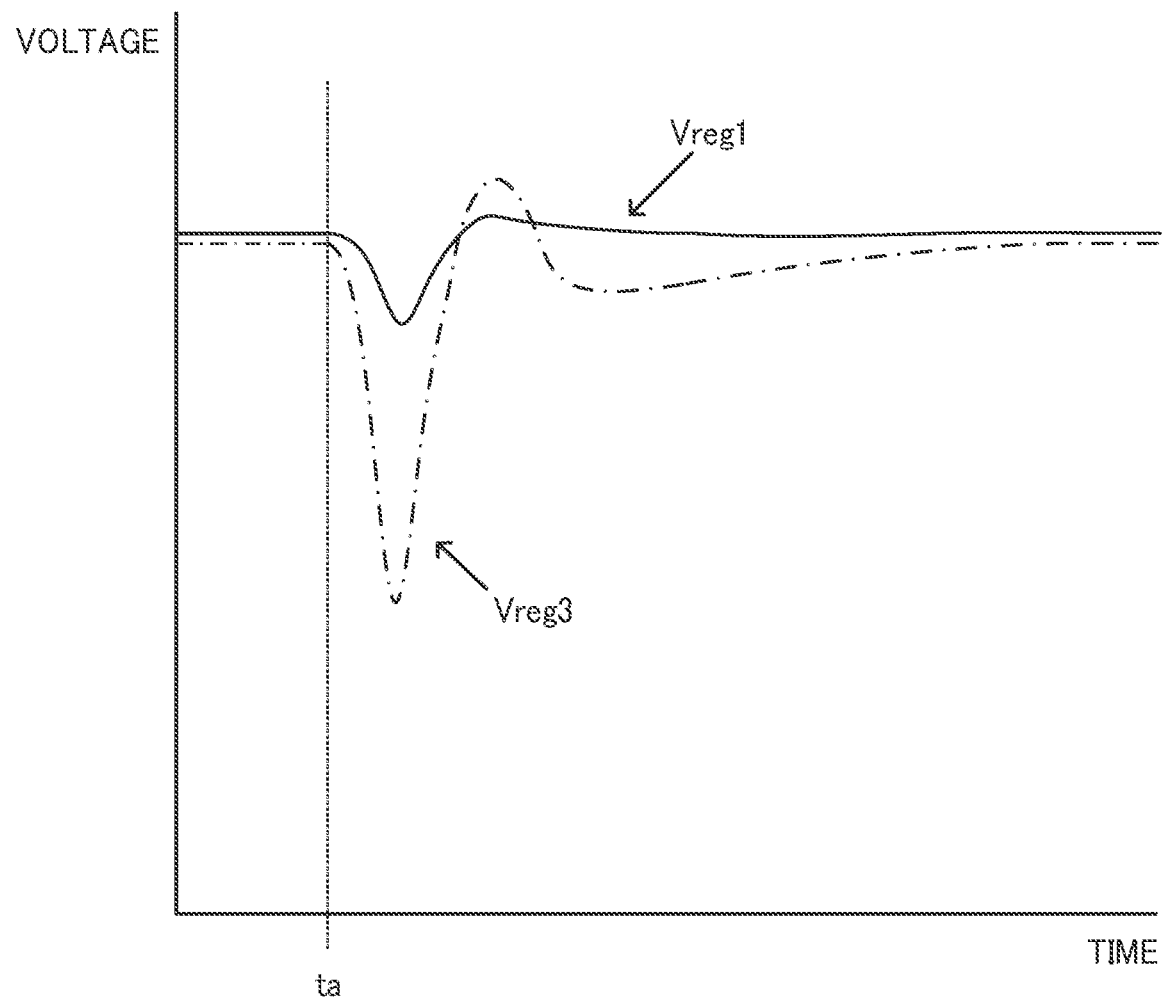
FIG. 12 is a diagram illustrating an example of operations of power supply circuits 40a and 40c.

FIG. 12 is a diagram illustrating a result of a comparison between a case of using the power supply circuit 40*a* and a case of using the power supply circuit 40*c* in the switching control IC 20.

<<Case of Using Power Supply Circuit 40*a*>>

First, a change in the power supply voltage Vreg1 when the switching control IC 20 uses the power supply circuit 40*a* will be described.

In response to the switching control IC 20 operating to thereby turn on the low-side IGBT 31 at time ta, for example, the voltage Vs becomes a negative voltage as described above. As a result, the "leakage current" flows from the terminal GND to the terminal S in FIG. 1, and thus the current flowing to the signal output circuit 42 increases. Note that the power supply circuit 40*a* includes the darlington-coupled NPN transistors 232 and 233, as described above. Thus, the power supply circuit 40*a* can output a large current while generating the power supply voltage Vreg1 at a target level.

As a result, as given by the solid line in FIG. 12, the power supply circuit 40*a* can prevent a large drop in the power supply voltage Vreg1, thereby being able to stabilize the operation of the switching control IC 20.

<<Case of Using Power Supply Circuit 40*c*>>

Next, a change in the power supply voltage Vreg3 when the switching control IC 20 uses the power supply circuit 40*c* will be described. In this case, it is assumed that the switching control IC 20 using the power supply circuit 40*c* operates, to thereby turn on the low-side IGBT 31 at a timing of the foregoing time ta.

In response to turning on of the IGBT 31, the "leakage current" flows from the terminal GND to the terminal S, and thus the current flowing to the signal output circuit 42 increases.

The output stability of the power supply circuit 40*c* is poor as compared with that of the power supply circuit 40*a*. For this reason, upon increase in the current flowing to the signal output circuit 42, the power supply voltage Vreg3 of the power supply circuit 40*c* greatly drops as given by the dashed-dotted line in FIG. 12. Depending on the level of the power supply voltage Vreg3, the signal output circuit 42 malfunctions and, for example, outputs the set pulse signal S1 in a wrong timing.

Accordingly, in the switching control IC 20 in which the voltage Vs is a negative voltage and the "leakage current" flows to the terminal S through the semiconductor region 120, it is preferable to use the power supply circuit 40*a* with the excellent output stability. With the use of the power supply circuit 40*a*, the switching control IC 20 can stabilize the operation of the switching control IC 20.

The case of using the power supply circuit 40*a* in the switching control IC 20 has been described here, however, the power supply circuit 40*b* also includes the multiple darlington-coupled transistors. Accordingly, it is also possible to stabilize the operation of the switching control IC 20 even when using the power supply circuit 40*b*.

===Summary===

The power module 10 according to an embodiment of the present disclosure has been described above. The resistance value of the variable resistor 200 of the power supply circuit 40*a* reaches the small resistance value Rb when the power supply circuit 40*a* starts up, and thereafter reaches the large resistance value Ra. Accordingly, with the use of the power supply circuit 40*a*, it is possible to generate a stable power supply voltage Vreg1 while reducing the start-up time.

The adjustment circuit 203 increases the resistance value of the variable resistor 200 after the level of the output voltage Vreg1 reaches a target level. Thus, in an embodiment of the present disclosure, the variable resistor 200 does not increase before the output voltage Vreg1 reaches a target level, thereby being able to reduce the start-up time more reliably.

The adjustment circuit 203 reduces the resistance value of the variable resistor 200 in response to stopping the generation of the output voltage Vreg1. Thus, it is possible to reduce the start-up time when the output voltage Vreg1 is generated after the generation of the output voltage Vreg1 is stopped.

The variable resistor 200 may include, for example, the resistor 210 and the PMOS transistor 212 coupled in parallel with the resistor 210. Even with such a configuration, it is possible to reduce the start-up time and improve the line regulation as well.

For instance, if the resistor 211 is not used in the variable resistor 200, a voltage that is substantially the power supply voltage Vcc is applied to the input node N1 when the power supply circuit 40*a* starts up, and this may cause the power supply voltage Vreg1 to exceed a target level. In an embodiment of the present disclosure, when the power supply circuit 40*a* starts up, the power supply voltage Vcc is applied to the input node N1 through the resistor 211 of the variable resistor 200. Thus, it is possible to prevent an overshoot of the power supply voltage Vreg1 when the power supply circuit 40*a* starts up.

For example, the adjustment circuit 203 can include: the detection circuit 250 that detects whether the predetermined time period T has elapsed since the generation of the output voltage Vreg1 is started; and the control circuit 251 that controls the PMOS transistor 212 based on the detection result of the detection circuit 250.

For example, as a circuit for measuring the predetermined time period T, an integrator circuit can be used. However, in the case of increasing the predetermined time period T, a resistance and the like of the integrator circuit need to be increased. The detection circuit 550 charges the capacitor 261 for measuring the predetermined time period T with a small current from the current mirror circuit, thereby being able to reduce the area to be occupied by the detection circuit 550 in the switching control IC 20.

Further, as the circuit for measuring the predetermined time period T, an integrator circuit of the detection circuit 250 can be used.

The voltage generation circuit 201 includes the Zener diode 220 and the diodes D1 to D5, thereby being able to temperature-compensate the power supply voltage Vreg1.

The output circuit 202 includes the darlington-coupled two-stage NPN transistors 232 and 233, thereby being able to increase the current driving capability.

In an embodiment of the present disclosure, the darlington-coupled two-stage transistors are the NPN transistors 232 and 233, respectively, however, for example, PNP transistors may also be used. Note that similar effects as those in an embodiment of the present disclosure can be obtained also when the power supply circuit 40a has a configuration including darlington-coupled transistors in three or more stages, for example.

It is possible to reduce the start-up time and improve the line regulation as well even when using a commonly used source follower circuit and emitter follower circuit instead of the output circuit 202, 502.

In the power supply circuit 40b, the adjustment circuit 203 may be used instead of the adjustment circuit 503, and in the power supply circuit 40a, the adjustment circuit 503 may be used instead of the adjustment circuit 203.

The present disclosure is directed to provision of a power supply circuit in which a start-up time is short and a stable power supply voltage can be generated.

According to the present disclosure, it is possible to provide a power supply circuit in which a start-up time is short and a stable power supply voltage can be generated.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

What is claimed is:

1. A power supply circuit configured to generate an output voltage at a target level from an input voltage thereof, the power supply circuit having a predetermined node therein, and comprising:
   a wiring configured to receive the input voltage;
   a variable resistor provided between the wiring configured to receive the input voltage and the predetermined node, the variable resistor being configured to pass a current from the wiring to the predetermined node;
   a voltage generation circuit configured to apply a voltage at a predetermined level to the predetermined node based on a current from the variable resistor;
   an output circuit configured to output the output voltage at the target level, in response to the voltage at the predetermined level being applied to the predetermined node; and
   an adjustment circuit electrically connected to the predetermined node through the variable resistor, the adjustment circuit being configured to increase a resistance value of the variable resistor in response to a predetermined time period having elapsed since starting of generation of the output voltage.

2. The power supply circuit according to claim 1, wherein the predetermined time period is longer than a time period from when the generation of the output voltage is started to when the output voltage reaches the target level.

3. The power supply circuit according to claim 1, wherein the adjustment circuit is further configured to decrease the resistance value of the variable resistor in response to stopping of the generation of the output voltage.

4. The power supply circuit according to claim 1, wherein the variable resistor includes
   a first resistor provided between the wiring and the predetermined node, and
   a switch provided in parallel with the first resistor, and
   the adjustment circuit
   turns on the switch in response to the starting of the generation of the output voltage, and
   turns off the switch in response to the predetermined time period having elapsed since the starting of the generation of the output voltage.

5. The power supply circuit according to claim 4, wherein the variable resistor further includes a second resistor coupled in series with the switch, the second resistor having a resistance value smaller than that of the first resistor.

6. The power supply circuit according to claim 5, wherein the adjustment circuit includes
   a detection circuit configured to detect whether the predetermined time period has elapsed since the starting of the generation of the output voltage, and
   a control circuit configured to control a state of the switch based on a detection result of the detection circuit.

7. The power supply circuit according to claim 6, further comprising a node to receive the output voltage, wherein the detection circuit includes
   a current mirror circuit configured to receive the output voltage, and to generate a current,
   a capacitor configured to receive the current generated by the current mirror circuit,
   a transistor configured to detect whether the predetermined time period has elapsed since the starting of the generation of the output voltage, based on a charge voltage of the capacitor and a predetermined threshold voltage, and
   a diode provided between the node to receive the output voltage and the capacitor.

8. The power supply circuit according to claim 6, further comprising a node to receive the output voltage, wherein the detection circuit includes
   an integrator circuit including a third resistor and a capacitor, the integrator circuit being configured to integrate the output voltage,
   a transistor configured to detect whether the predetermined time period has elapsed since the starting of the generation of the output voltage, based on a charge voltage of the capacitor and a predetermined threshold voltage, and
   a diode provided between the node to receive the output voltage and the capacitor.

9. The power supply circuit according to claim 1, wherein the voltage generation circuit includes a Zener diode and a plurality of diodes coupled in series with the Zener diode.

10. The power supply circuit according to claim 1, wherein the output circuit includes a plurality of darlington-coupled transistors configured to generate the output voltage based on the voltage at the predetermined level.

11. A switching control circuit configured to control switching of a first switching device on a power supply side and a second switching device on a ground side, the first and second switching devices being configured to drive a load, the switching control circuit comprising:
   a signal output circuit configured to output, in response to an input signal thereof,
   a set signal to turn on the first switching device and
   a reset signal to turn off the first switching device;

a level shifter circuit configured to shift a level of each of the set signal and the reset signal;

a driver circuit configured to drive the first switching device in response to an output from the level shifter circuit; and a power supply circuit configured to generate an output voltage at a target level from an input voltage thereof, and to supply the output voltage as a power supply voltage of the signal output circuit, wherein the power supply circuit has a predetermined node therein, and includes a wiring configured to receive the input voltage;

a variable resistor provided between the wiring configured to receive the input voltage and the predetermined node, the variable resistor being configured to pass a current from the wiring to the predetermined node, a voltage generation circuit configured to apply a voltage at a predetermined level to the predetermined node based on a current from the variable resistor, an output circuit configured to output the output voltage at the target level, in response to the voltage at the predetermined level being applied to the predetermined node, and an adjustment circuit electrically connected to the predetermined node through the variable resistor, the adjustment circuit being configured to increase a resistance value of the variable resistor in response to a predetermined time period having elapsed since starting of generation of the output voltage.

12. A power supply circuit configured to generate an output voltage at a target level from an input voltage thereof, the power supply circuit having a predetermined node therein, and comprising:

a wiring configured to receive the input voltage;

a variable resistor provided between the wiring configured to receive the input voltage and the predetermined node;

a voltage generation circuit configured to apply a voltage at a predetermined level to the predetermined node based on a current from the variable resistor;

an output circuit configured to output the output voltage at the target level, in response to the voltage at the predetermined level being applied to the predetermined node; and an adjustment circuit configured to increase a resistance value of the variable resistor such that the current flowing from the variable resistor to the predetermined node decreases, in response to a predetermined time period having elapsed since starting of generation of the output voltage.

\* \* \* \* \*